United States Patent
Lim et al.

(10) Patent No.: US 10,879,370 B2
(45) Date of Patent: Dec. 29, 2020

(54) ETCHING BACK AND SELECTIVE DEPOSITION OF METAL GATE

(71) Applicant: Taiwan Semiconductor Manufacturing Company, Ltd., Hsinchu (TW)

(72) Inventors: Peng-Soon Lim, Johor (MY); Cheng-Lung Hung, Hsinchu (TW); Mao-Lin Huang, Hsinchu (TW); Weng Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/621,518

(22) Filed: Jun. 13, 2017

(65) Prior Publication Data

US 2018/0175165 A1 Jun. 21, 2018

Related U.S. Application Data

(60) Provisional application No. 62/434,889, filed on Dec. 15, 2016.

(51) Int. Cl.
*H01L 29/66* (2006.01)
*H01L 21/28* (2006.01)
*H01L 29/423* (2006.01)
*H01L 29/78* (2006.01)

(52) U.S. Cl.
CPC .. *H01L 29/66545* (2013.01); *H01L 21/28026* (2013.01); *H01L 29/42376* (2013.01); *H01L 29/66583* (2013.01); *H01L 29/66636* (2013.01); *H01L 29/66795* (2013.01); *H01L 29/785* (2013.01)

(58) Field of Classification Search
CPC ......... H01L 29/72376; H01L 29/66545; H01L 29/7856; H01L 29/6681; H01L 29/7851; H01L 29/401; H01L 29/42376; H01L 21/28079; H01L 21/28088; H01L 21/31133; H01L 21/32115; H01L 21/823842; H01L 21/823828; H01L 27/092; H01L 27/0922
See application file for complete search history.

(56) References Cited

U.S. PATENT DOCUMENTS 8,772,109 B2 7/2014 Colinge
8,785,285 B2 7/2014 Tsai et al.
8,816,444 B2 8/2014 Wann et al.
(Continued)

FOREIGN PATENT DOCUMENTS

WO 2016110793 A1 7/2016

*Primary Examiner* — Eric A. Ward
*Assistant Examiner* — Eric K Ashbahian
(74) *Attorney, Agent, or Firm* — Slater Matsil, LLP

(57) ABSTRACT

A method includes forming a dummy gate stack, forming a dielectric layer, with the dummy gate stack located in the dielectric layer, removing the dummy gate stack to form an opening in the dielectric layer, forming a metal layer extending into the opening, and etching back the metal layer. The remaining portions of the metal layer in the opening have edges lower than a top surface of the dielectric layer. A conductive layer is selectively deposited in the opening. The conductive layer is over the metal layer, and the metal layer and the conductive layer in combination form a replacement gate.

20 Claims, 20 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,379,221 B1 * | 6/2016 | He .................... H01L 29/6681 |
| 9,520,482 B1 | 12/2016 | Chang et al. |
| 9,576,814 B2 | 2/2017 | Wu et al. |
| 2013/0309857 A1 * | 11/2013 | Koburger III ........ H01L 21/845 |
| | | 438/591 |
| 2014/0264483 A1 | 9/2014 | Yoshida et al. |
| 2015/0108577 A1 * | 4/2015 | Cai .................. H01L 21/28008 |
| | | 257/369 |
| 2015/0349075 A1 * | 12/2015 | Fan ...................... H01L 27/092 |
| | | 257/369 |
| 2016/0071944 A1 * | 3/2016 | Lu et al. ........................ 257/331 |
| 2016/0204221 A1 * | 7/2016 | He .................... H01L 29/6681 |
| | | 438/283 |
| 2017/0125534 A1 * | 5/2017 | Hsieh et al. |
| 2017/0162675 A1 * | 6/2017 | Yim ................... H01L 21/0217 |

\* cited by examiner

ETCHING BACK AND SELECTIVE DEPOSITION OF METAL GATE

PRIORITY CLAIM AND CROSS-REFERENCE

This application claims the benefit of the following provisionally filed U.S. Patent application: Application Ser. No. 62/434,889, filed Dec. 15, 2016, and entitled "Etching Back and Selective Deposition of Metal Gate;" which application is hereby incorporated herein by reference.

BACKGROUND

Metal-Oxide-Semiconductor (MOS) devices are basic building elements in integrated circuits. An existing MOS device typically has a gate electrode formed of polysilicon doped with p-type or n-type impurities, using doping operations such as ion implantation or thermal diffusion. The work function of the gate electrode may be adjusted to the band-edge of silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also known as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, wherein the metallic gates used in NMOS devices and PMOS devices may also have band-edge work functions. Accordingly, the resulting metal gates include a plurality of layers to meet the requirements of the NMOS devices and PMOS devices.

The formation of metal gates typically involves depositing metal layers and then performing Chemical Mechanical Polish (CMP) to remove excess portions of the metal layers. The remaining portions of the metal layers form metal gates. The metal gates are then recessed, forming recesses between gate spacers, so that the recesses may be filled with hard masks for isolating the metal gates. To reduce the loading effect in the recessing of metal gates, the metal gates of long-channel devices and the metal gates of short channel devices are recessed in separate processes, hence multiple etch-back processes are involved. During these processes, the inter-layer dielectric, in which the metal gates are located, may be thinned excessively, resulting in the gate loss problem.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 15A illustrate the cross-sectional views and perspective views of intermediate stages in the formation of Fin Field-Effect Transistors (FinFETs) in accordance with some embodiments.

DETAILED DESCRIPTION

Figure 1:
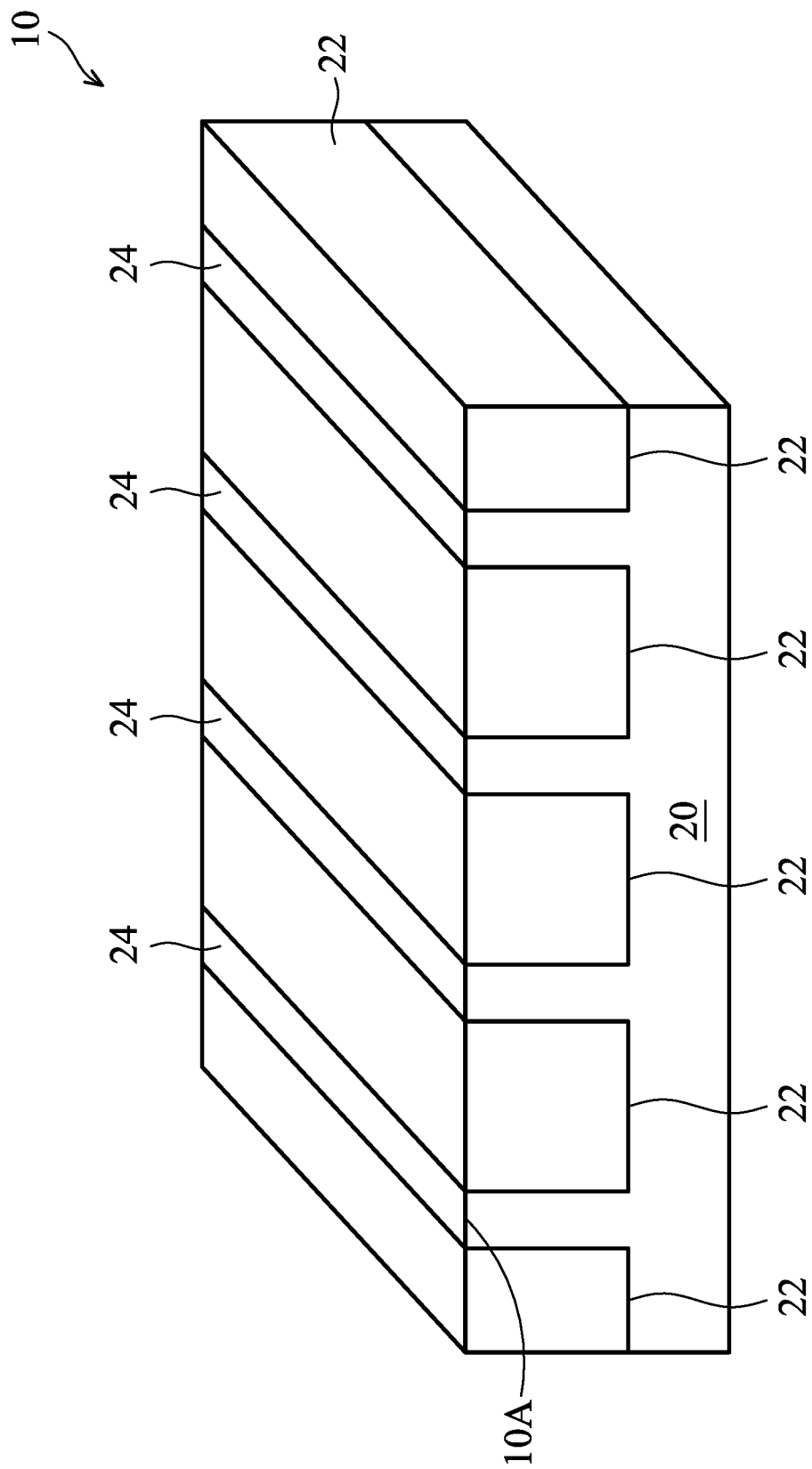

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concepts of the present disclosure. Planar transistors may also adopt the concept of the present disclosure.

FIGS. 1 through 15A illustrate the cross-sectional views and perspective views of intermediate stages in the formation of transistors in accordance with some embodiments of the present disclosure. The steps shown in FIGS. 1 through 15A are also reflected schematically in the process flow shown in FIG. 16. The formed transistors include a long-channel transistor (such as a long-channel FinFET as an example) and a short-channel transistor (such as a short-channel FinFET as an example) in accordance with some exemplary embodiments.

The process steps shown in FIGS. 1 through 6 may represent an exemplary process for forming both or either one of the long-channel FinFET and the short-channel FinFET. Accordingly, the formation of semiconductor fins, dummy gate stacks, source/drain regions, and source/drain silicide regions, etc. of both or either one of the long-channel FinFET and the short-channel FinFET can adopt the process in FIGS. 1 through 6.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20, wherein the top surface of substrate 20 is a major surface 10A of wafer 10. The portions of substrate 20 between neighboring STI regions 22 are referred to as semiconductor strips 24. The top surfaces of semiconductor strips 24 and the top surfaces of STI regions 22 may be substantially level with each other in accordance with some exemplary embodiments.

STI regions 22 may include a liner oxide (not shown). The liner oxide may be formed of a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
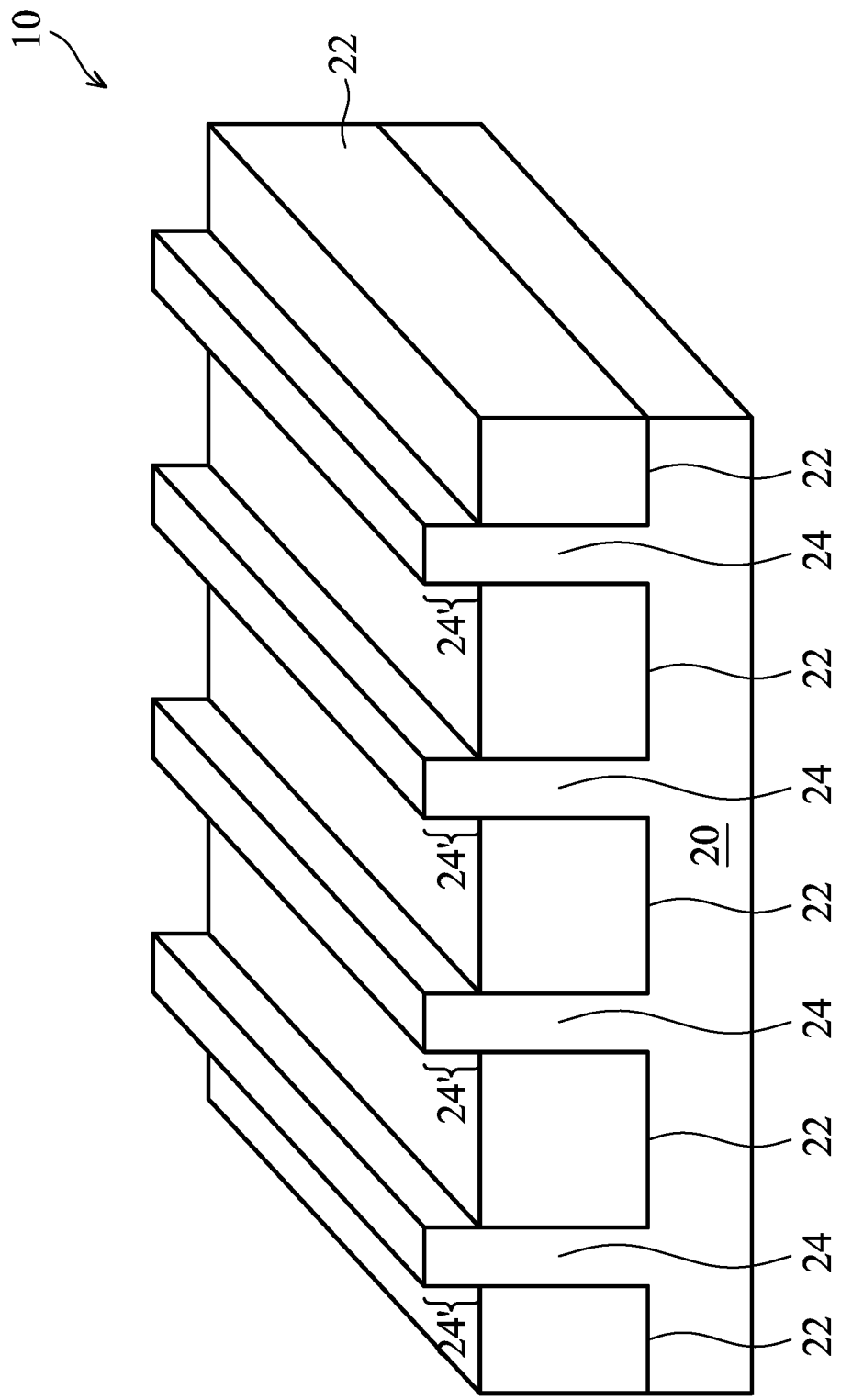

Referring to FIG. 2, STI regions 22 are recessed, so that the top portions of semiconductor strips 24 protrude higher than the top surfaces of STI regions 22 to form protruding fins 24'. The respective step is illustrated as step 302 in the process flow shown in FIG. 16. The etching may be performed using a dry etching process, wherein $H_2$ and $NF_3$ are used as the etching gases. During the etching process, plasma may be generated. Argon may also be included. In accordance with alternative embodiments of the present disclosure, the recessing of STI regions 22 is performed using a wet etch process. The etching chemical may include diluted HF, for example.

Figure 3:
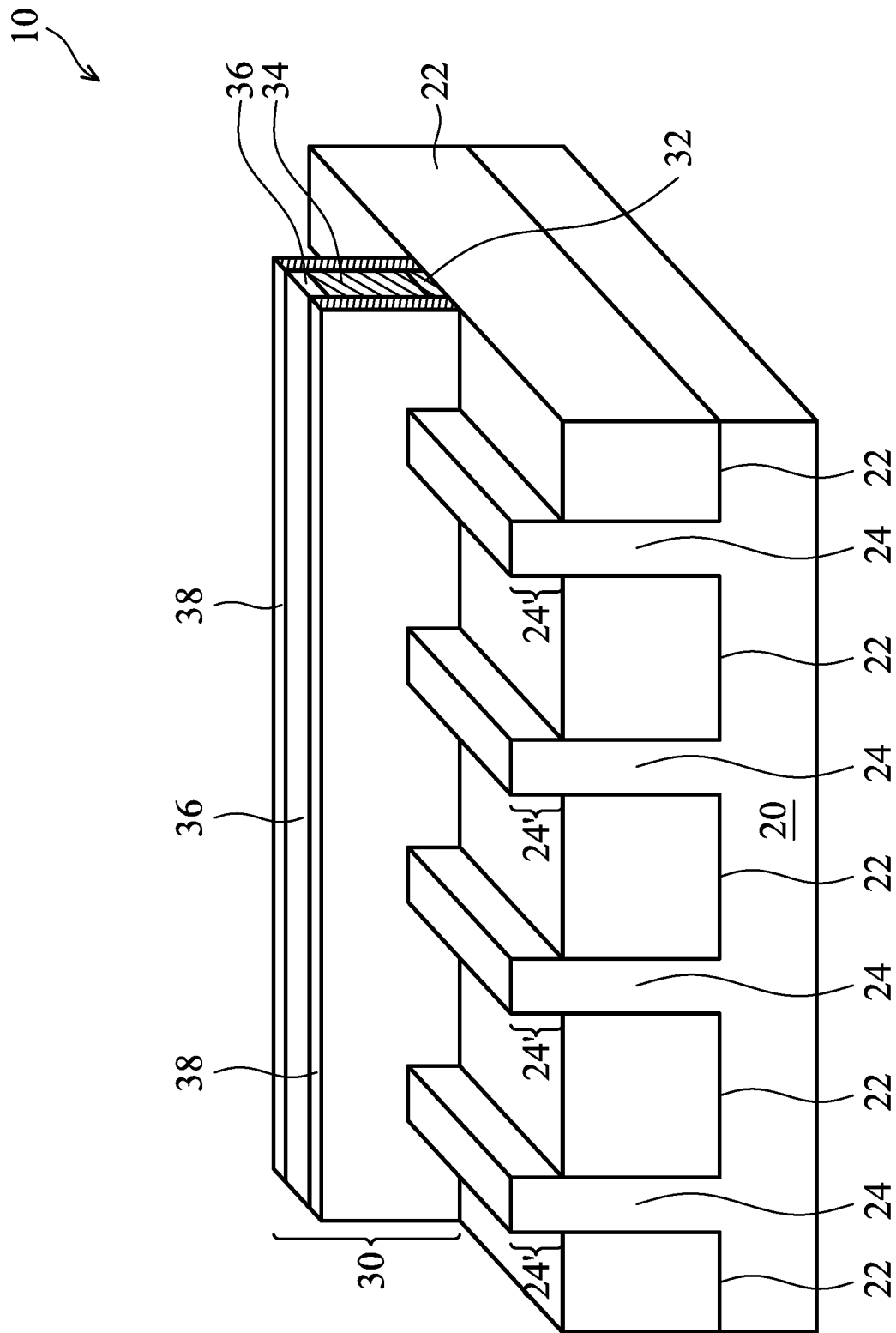

Referring to FIG. 3, dummy gate stack 30 is formed on the top surfaces and the sidewalls of protruding fins 24'. The respective step is illustrated as step 304 in the process flow shown in FIG. 16. Dummy gate stack 30 may include dummy gate dielectric 32 and dummy gate electrode 34 over dummy gate dielectric 32. Dummy gate electrode 34 may be formed, for example, using polysilicon, and other materials may also be used. Dummy gate stack 30 may also include one (or a plurality of) hard mask layer 36 over dummy gate electrode 34. Hard mask layer 36 may be formed of silicon nitride, silicon carbo-nitride, or the like. Dummy gate stack 30 may cross over a single one or a plurality of protruding fins 24' and/or STI regions 22. Dummy gate stack 30 may also have a lengthwise direction perpendicular to the lengthwise direction of protruding fins 24'.

Next, gate spacers 38 are formed on the sidewalls of dummy gate stack 30. In the meantime, fin spacers (not shown) may also be formed on the sidewalls of protruding fins 24'. In accordance with some embodiments of the present disclosure, gate spacers 38 are formed of a dielectric material such as silicon oxy-carbo-nitride (SiOCN), silicon nitride, or the like, and may have a single-layer structure or a multi-layer structure including a plurality of dielectric layers.

Figure 4:
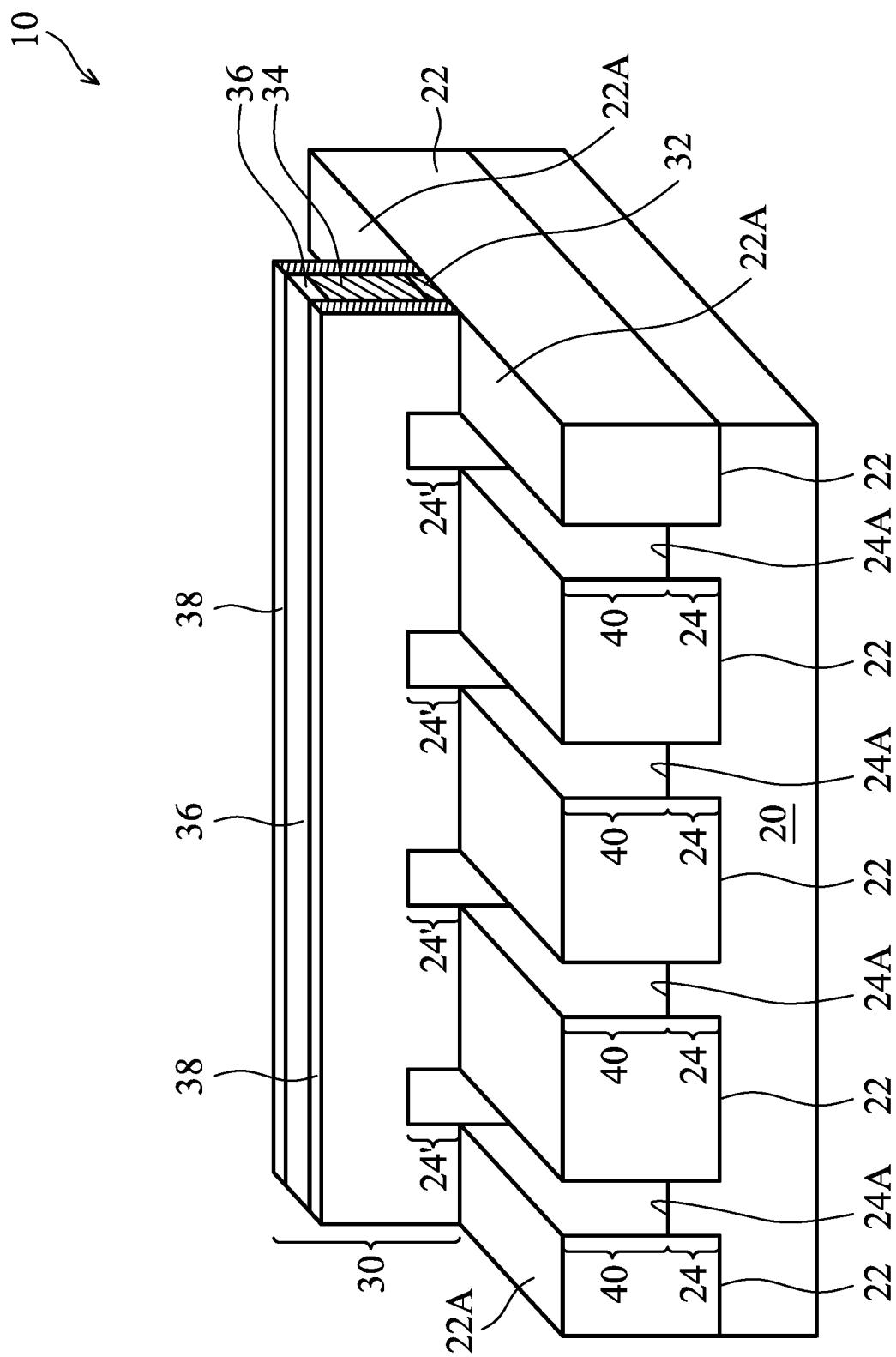

An etching step (referred to as source/drain recessing hereinafter) is then performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stack 30 and gate spacers 38 are protected, and are not etched. The top surfaces 24A of the recessed semiconductor strips 24 may be lower than the top surfaces 22A of STI regions 22 in accordance with some embodiments. Recesses 40 are accordingly formed between STI regions 22. Recesses 40 are located on opposite sides of dummy gate stack 30.

Figure 5:
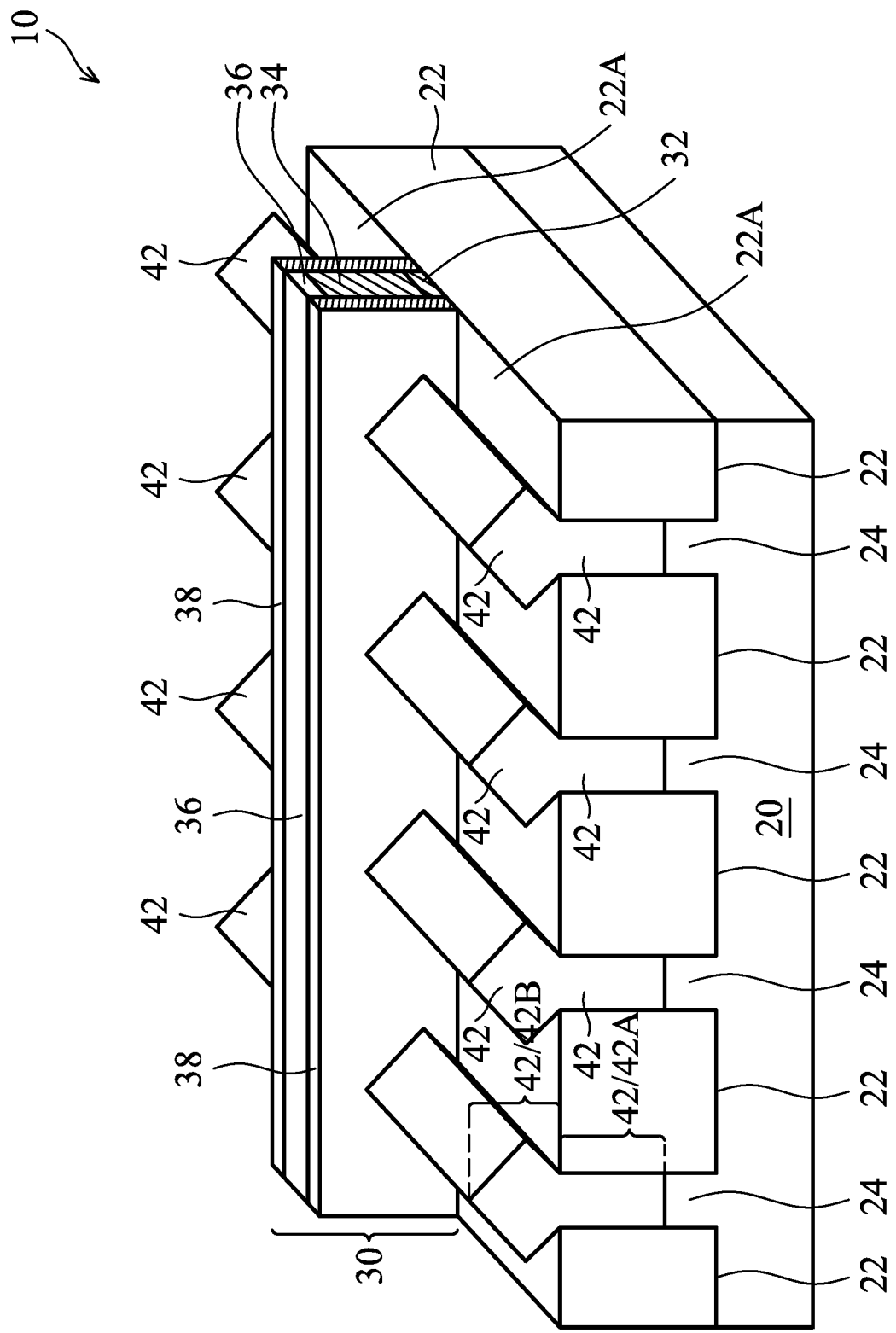

Next, epitaxy regions (source/drain regions) are formed by selectively growing a semiconductor material in recesses 40, resulting in the structure in FIG. 5. The respective step is illustrated as step 306 in the process flow shown in FIG. 16. In accordance with some exemplary embodiments, epitaxy regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 42 is formed of a III-V compound semiconductor such as GaAs, InP, GaN, InGaAs, InAlAs, GaSb, AlSb, AlAs, AlP, GaP, combinations thereof, or multi-layers thereof. After recesses 40 are filled with epitaxy regions 42, the further epitaxial growth of epitaxy regions 42 cause epitaxy regions 42 to expand horizontally, and facets may be formed.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy. Epitaxy regions 42 include lower portions 42A that are formed in STI regions 22, and upper portions 42B that are formed over the top surfaces 22A of STI regions 22. Lower portions 42A, whose sidewalls are shaped by the shapes of recesses 40 (FIG. 4), may have (substantially) straight edges, which may also be substantial vertical edges that are substantial perpendicular to the major surfaces (such as bottom surface 20B) of substrate 20.

Figure 6:
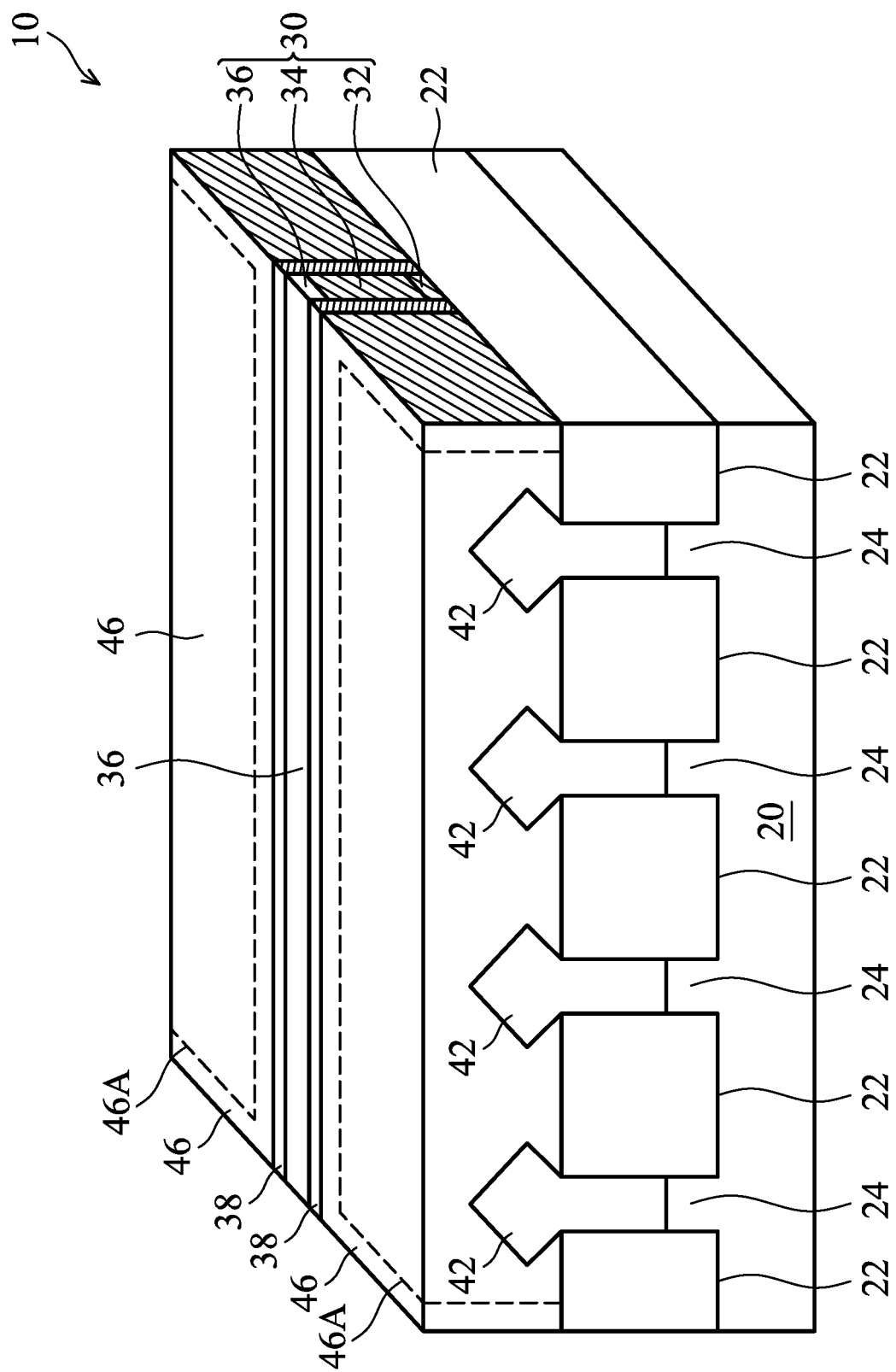

FIG. 6 illustrates a perspective view of the structure with Inter-Layer Dielectric (ILD) 46 being formed. The respective step is illustrated as step 308 in the process flow shown in FIG. 16. In accordance with some embodiments of the present disclosure, a buffer oxide layer (not shown) and a Contact Etch Stop Layer (CESL, not shown) are formed on source and drain regions 42 before the formation of ILD 46. The buffer oxide layer may be formed of silicon oxide, and the CESL may be formed of silicon nitride, silicon carbo-nitride, or the like. The buffer oxide layer and the CESL may be formed using a conformal deposition method such as ALD, for example. ILD 46 may include a dielectric material formed using, for example, FCVD, spin-on coating, CVD, or other deposition methods. ILD 46 may also be formed of Phospho-Silicate Glass (PSG), Boro-Silicate Glass (BSG), Boron-Doped Phospho-Silicate Glass (BPSG), Tetra Ethyl Ortho Silicate (TEOS) oxide, or the like. A Chemical Mechanical Polish (CMP) may be performed to level the top surfaces of ILD 46, dummy gate stack 30, and gate spacers 38 with each other.

Figure 7A:
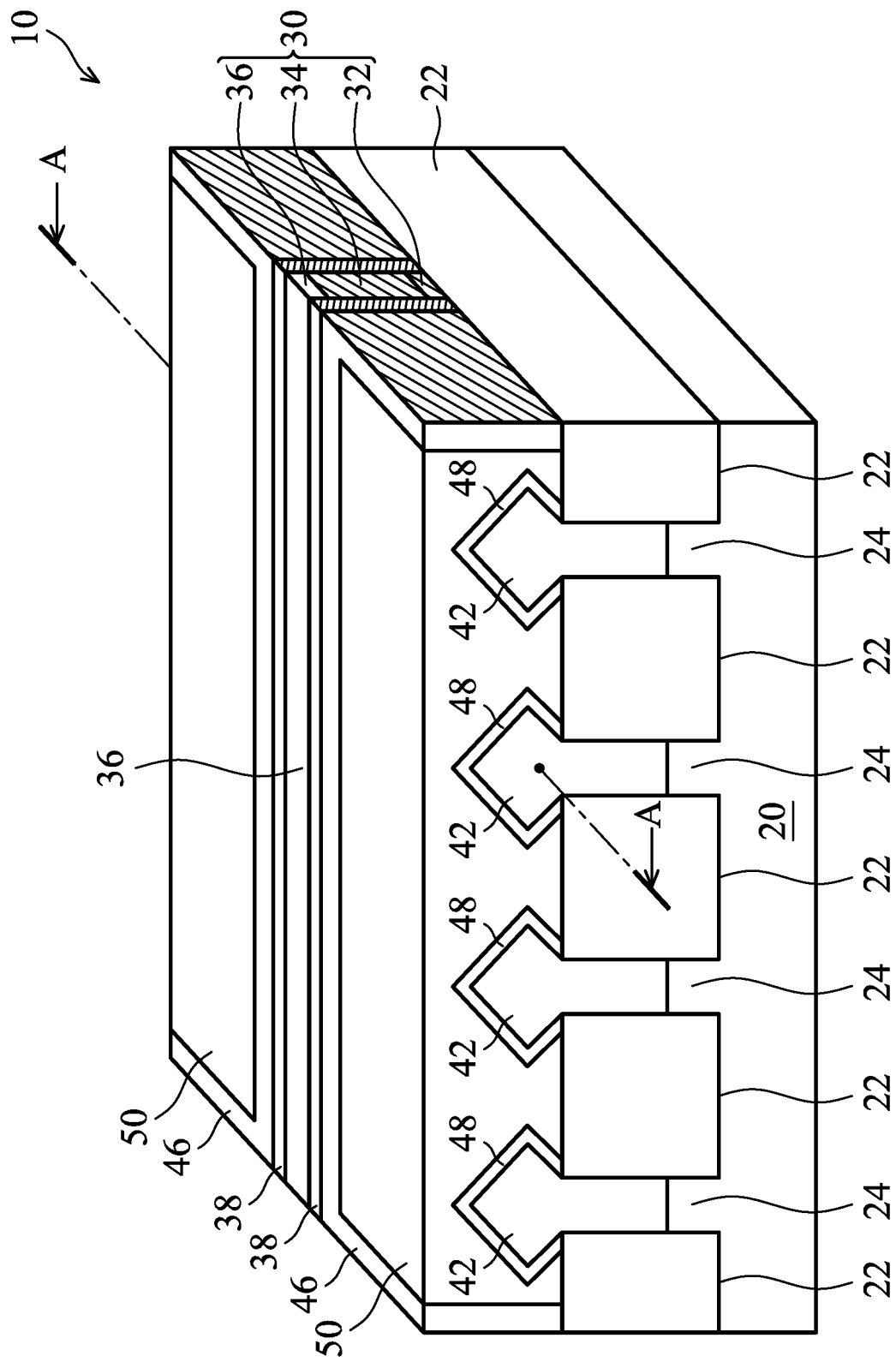
Figure 7B:
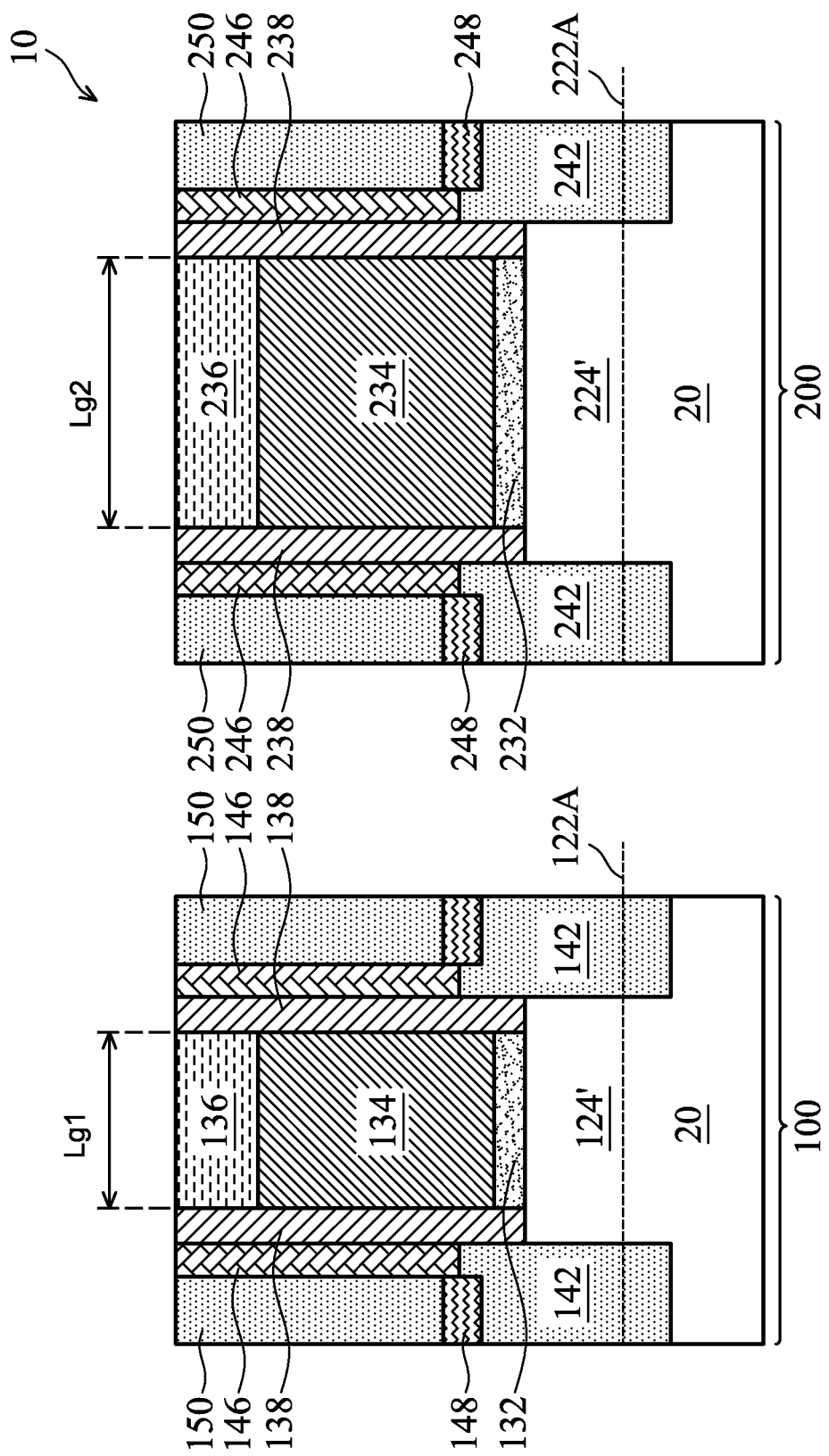

FIG. 7A illustrates a perspective view of a structure after source/drain silicide regions 48 are formed on source/drain regions 42. Contact plugs 50 are formed to extend into ILD 46 to contact source/drain silicide regions 48. FIG. 7B illustrates the cross-sectional views of an intermediate structure in the formation of a short-channel FinFET and a long-channel FinFET on same substrate 20. The short-channel FinFET is formed in device region 100, and the long-channel FinFET is formed in device region 200. The short-channel device has a channel shorter than the channel of the long-channel device, as illustrated. For example, the channel-length $Lg_1$ of the short-channel device may be smaller than about 32 nm, and the channel-length $Lg_2$ of the long-channel device may be greater than about 72 nm. The ratio $Lg_2/Lg_1$ may be greater than about 2.5 in accordance with some embodiments. In accordance with some embodiments, the short-channel device is a core transistor or a transistor in Static Random Access Memory (SRAM), and the long-channel device is a transistor in a driver circuit or a peripheral circuit. Either one of the short-channel device and the long-channel device may correspond to the cross-sectional view obtained from the vertical plane containing line A-A in FIG. 7A.

To distinguish the features in the short-channel device from the features in the long-channel device, the features in the short-channel device are represented using the reference numerals of the corresponding features in FIG. 7A plus number 100, and the features in the long-channel device are represented using the reference numerals of the corresponding features in FIG. 7A plus number 200. For example, the source/drain regions 142 and 242 in FIG. 7B correspond to source/drain region 42 in FIG. 7A, and silicide regions 148 and 248 in FIG. 7B correspond to source/drain silicide regions in FIG. 7A. The corresponding features in the short-channel device and the long-channel device may be formed in common processes.

After the structure shown in FIG. 7B is formed, the dummy gate stacks including hard mask layers 136 and 236, dummy gate electrodes 134 and 234, and dummy gate dielectrics 132 and 232 are replaced with metal gates and replacement gate dielectrics, as shown in FIGS. 8 through 15A. In FIGS. 8 through 15A, the top surfaces 122A and 222A of STI regions 22 are illustrated, and semiconductor fins 124' and 224' protrude higher than top surfaces 122A and 222A, respectively.

Figure 8:
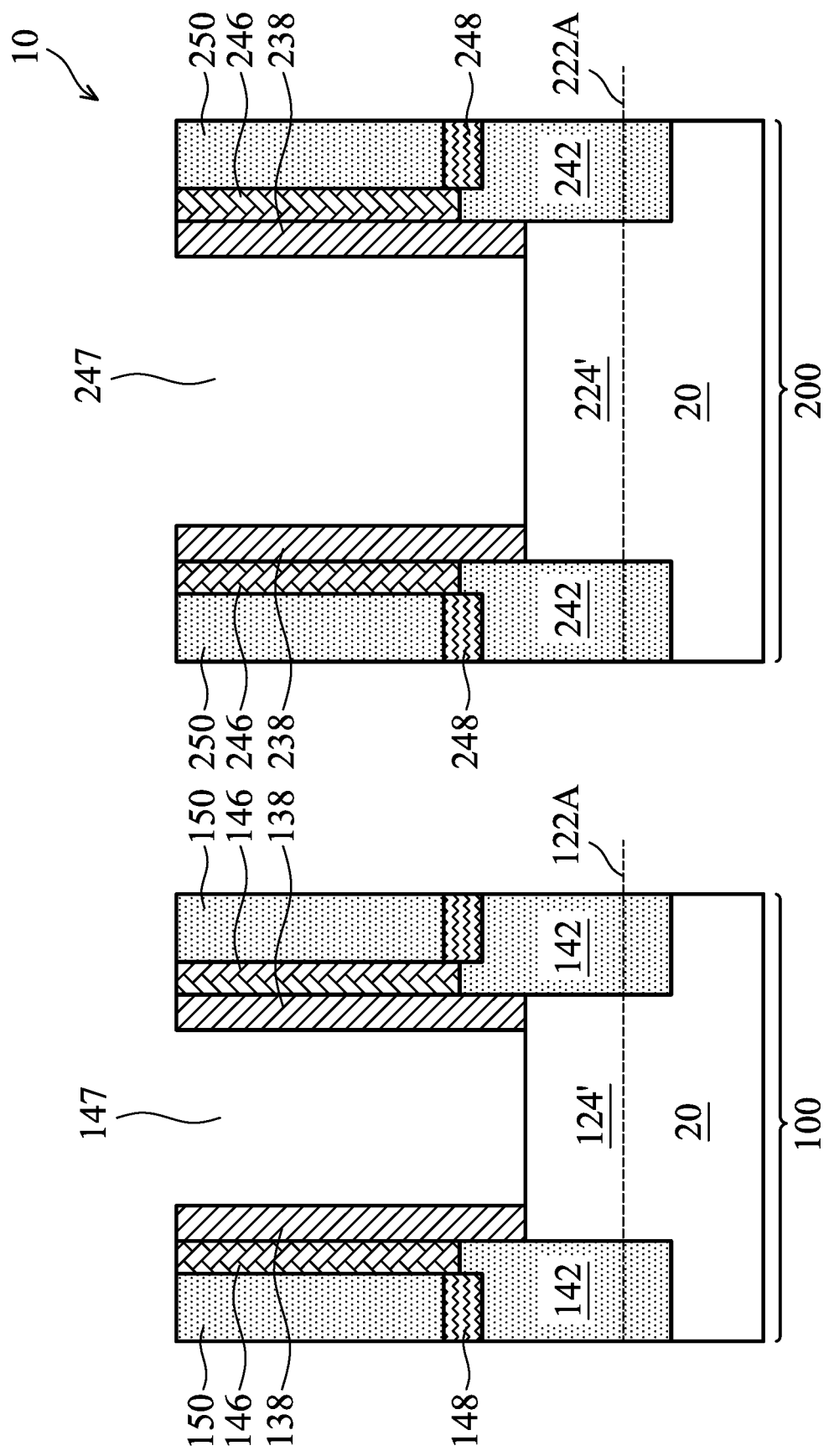

To form the replacement gates, hard mask layers 136 and 236, dummy gate electrodes 134 and 234, and dummy gate dielectrics 132 and 232 as shown in FIG. 7B are removed, forming openings 147 and 247 as shown in FIG. 8. The respective step is illustrated as step 310 in the process flow shown in FIG. 16. The top surfaces and the sidewalls of protruding fins 124' and 224' are exposed to openings 147 and 247, respectively.

Figure 9:
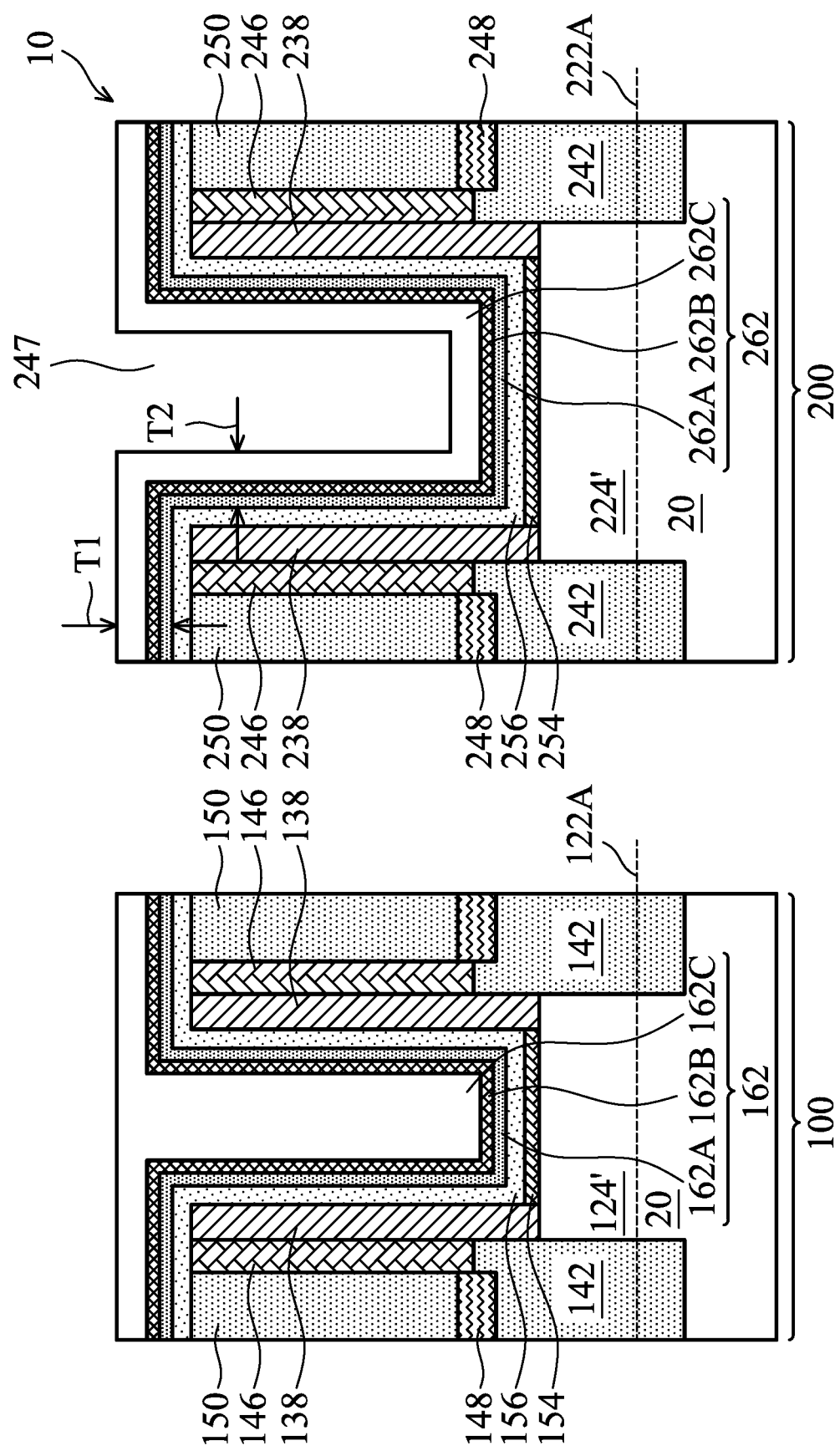

Next, referring to FIG. 9, gate dielectrics 154/156 and 254/256 are formed, which extend into openings 147 and 247, respectively. The respective step is illustrated as step 312 in the process flow shown in FIG. 16. In accordance with some embodiments of the present disclosure, the gate dielectrics include Interfacial Layers (ILs) 154 and 254, which are formed on the exposed surfaces of protruding fins 124' and 224', respectively. ILs 154 and 254 may include an oxide layer such as a silicon oxide layer, which is formed through the thermal oxidation of protruding fins 124' and 224', a chemical oxidation process, or a deposition process. The gate dielectrics may also include high-k dielectric layers 156 and 256 over the corresponding ILs 154 and 254. High-k dielectric layers 156 and 256 may be formed of a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. High-k dielectric layers 156 and 256 are overlying, and may contact, the respective underlying ILs 154 and 254. High-k dielectric layers 156 and 256 are formed as conformal layers, and extend on the sidewalls of protruding fins 124' and 224' and the top surface and the sidewalls of gate spacers 138 and 238, respectively. In accordance with some embodiments of the present disclosure, high-k dielectric layers 156 and 256 are formed using ALD or CVD.

Further referring to FIG. 9, metal-containing conductive layers 162 and 262 are formed through deposition. The respective step is illustrated as step 314 in the process flow shown in FIG. 16. The deposition may be performed using a conformal deposition method such as ALD or CVD, so that the horizontal thickness T1 of the horizontal portions and vertical thickness T2 of the vertical portions of metal-containing layer 262 (and each of sub-layers) have thicknesses substantially equal to each other. For example, horizontal thickness T1 and vertical thickness T2 may have a difference smaller than about 20 percent or 10 percent of either of thicknesses T1 and T2. In accordance with some embodiments of the present disclosure, metal-containing layer 262 extends into opening 247, and includes some portions over ILD 246.

In the same deposition process metal-containing layer 262 is formed, opening 147 (FIG. 8) is also filled with metal-containing conductive layers 162. Since opening 147 is narrow, it may be fully filled (or substantially fully filled with a small portion left).

Each of metal-containing layers 162 and 262 includes at least one layer, or may include a plurality of layers (such as 162A/262A, 162B/262B, and 162C/262C) formed of different materials. The corresponding layers in metal-containing conductive layers 162 and 262 are formed in common deposition processes. The specific material of the layers in metal-containing layers 162 and 262 may be work-function metals selected according to whether the respective FinFET is an n-type FinFET or a p-type FinFET. For example, when the FinFET is an n-type FinFET, layers 162A/262A, 162B/262B, and 162C/262C may include a titanium nitride (TiN) layer, a tantalum nitride (TaN) layer, and an Al-based layer (formed of, for example, TiAl, TiAlN, TiAlC, TaAlN, or TaAlC), respectively. When the FinFET is a p-type FinFET, layers 162A/262A, 162B/262B, and 162C/262C may include a TiN layer, a TaN layer, and another TiN layer, respectively. Layers 162 and 262 may also include two layers or more than three layers.

Figure 10:
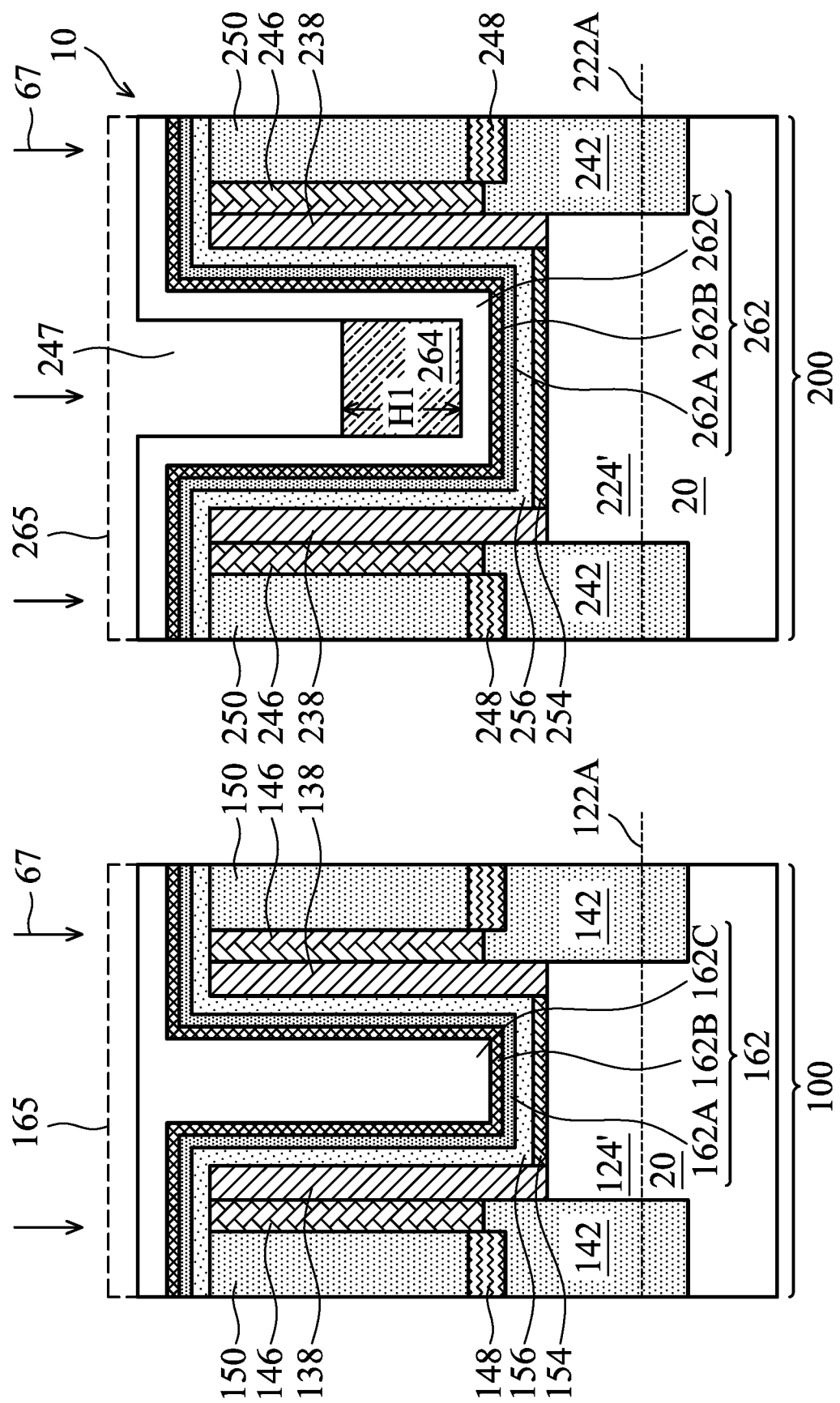

After the deposition of metal-containing layers 162 and 262, protection layer 264 is formed to fill the remaining portions of opening 247, as shown in FIG. 10. The respective step is illustrated as step 316 in the process flow shown in FIG. 16. In accordance with some embodiments, protection layer 264 is formed of a material that is different from the materials of the underlying layers 256 and 262, so that in the subsequent etching steps, protection layer 264 can be used as an etching mask to protect the underlying portions of layers 262 and 256. For example, protection layer 264 may be formed of an organic material such as a photo resist or a material dominated with carbon, hydrogen, and oxygen, which material is suitable for forming a Bottom Anti-Reflective coating (BARC). Protection layer 264 may also be formed of an inorganic material such as silicon oxide, silicon nitride, silicon carbide, amorphous silicon (α-Si), or the like that is able to withstand etch. Protection layer 264 may have a substantially planar top surface, which is caused by spin coating if it is used. A planarization step such as CMP may be performed if needed. Dashed lines 165 and 265 schematically illustrate the top surfaces of protection layer 264 after the coating.

FIG. 10 also illustrates the etch-back of protection layer 264, which is symbolized by arrows 67. The respective step is also illustrated as step 316 in the process flow shown in FIG. 16. The etching may include a dry etch and/or a wet etch. Furthermore, the etch may be isotropic or anisotropic. In accordance with some embodiments of the present disclosure, the etch-back is performed using an etchant that etches layer 264, but hardly attacks layer(s) 162C/262C. In accordance with some exemplary embodiments in which layer 264 is formed of amorphous silicon, layer 264 may be etched back using a mixture of HBr, $Cl_2$, and $O_2$, $CF_4$, or HF. During the etch-back, the portions of protection layer 264 over ILDs 146 and 246 are fully removed, while a portion remains in opening 247.

Figure 11:
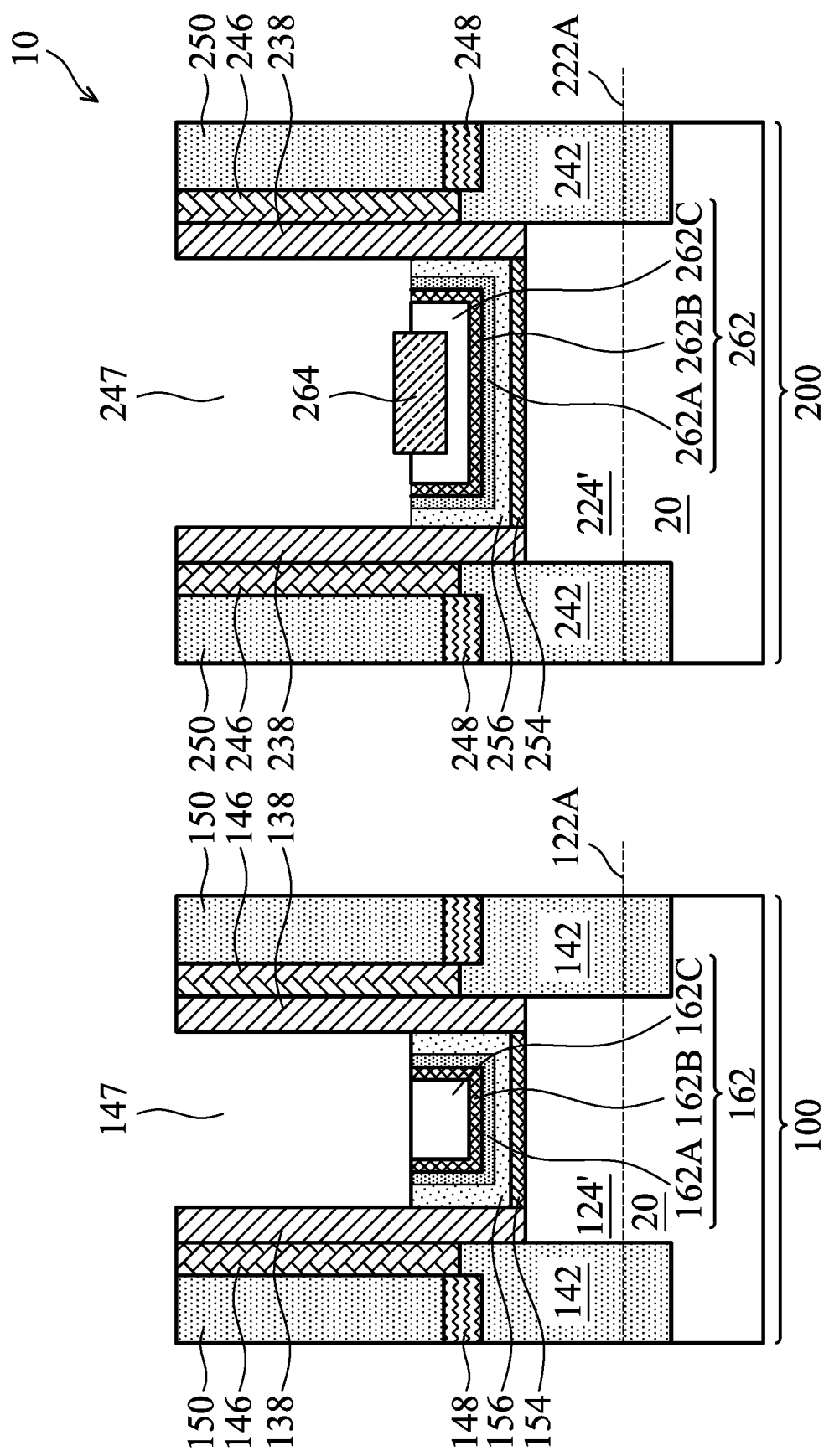

Next, as shown in FIG. 11, protection layer 264 is used as an etching mask to etch metal-containing layer 262, so that the top surface/edge of layer 262 is lowered. The respective step is illustrated as step 318 in the process flow shown in FIG. 16. Gate dielectric 256 may or may not be etched at the same time metal-containing layer 262 is etched. In the same etching process, metal-containing layer 162 is also etched. The etchant may also be selected to attack (or selected not to attack) dielectric layers 156 and 256. The etchant for etching metal-containing layers 162 and 262 is selected so that it does not attack gate spacers 138/238 and ILDs 146 and 246. Also, when each of metal-containing layers 162 and 262 includes multiple sub-layers, the etchant may be selected to make the etching rates of the sub-layers to be uniform. As a result, after the etching, the top surfaces of layers 156, 162A, 162B, and 162C (and 256, 262A, 262B, and 262C) may be substantially coplanar. It is appreciated that there may be differences in etching rates of these layers, and each of the top surfaces of layers 156, 162A, 162B, and 162C (and 256, 262A, 262B, and 262C) may be higher than, lower than, or coplanar with the top surface of other layers in any combination.

During the etching-back of metal-containing layers 162 and 262, protection layer 264 may also be consumed partially. In accordance with some embodiments, the top height H1 of protection layer 264 (FIG. 10) measured before the etching of metal-containing layers 162 and 262 is selected (for example, to be greater than about 20 nm), so that after metal-containing layers 162 and 262 are etched, there is still a portion of protection layer 264 left in order to keep an adequate process margin to prevent layers 256, 262A, 262B, and 262C to be etched through.

Figure 12:
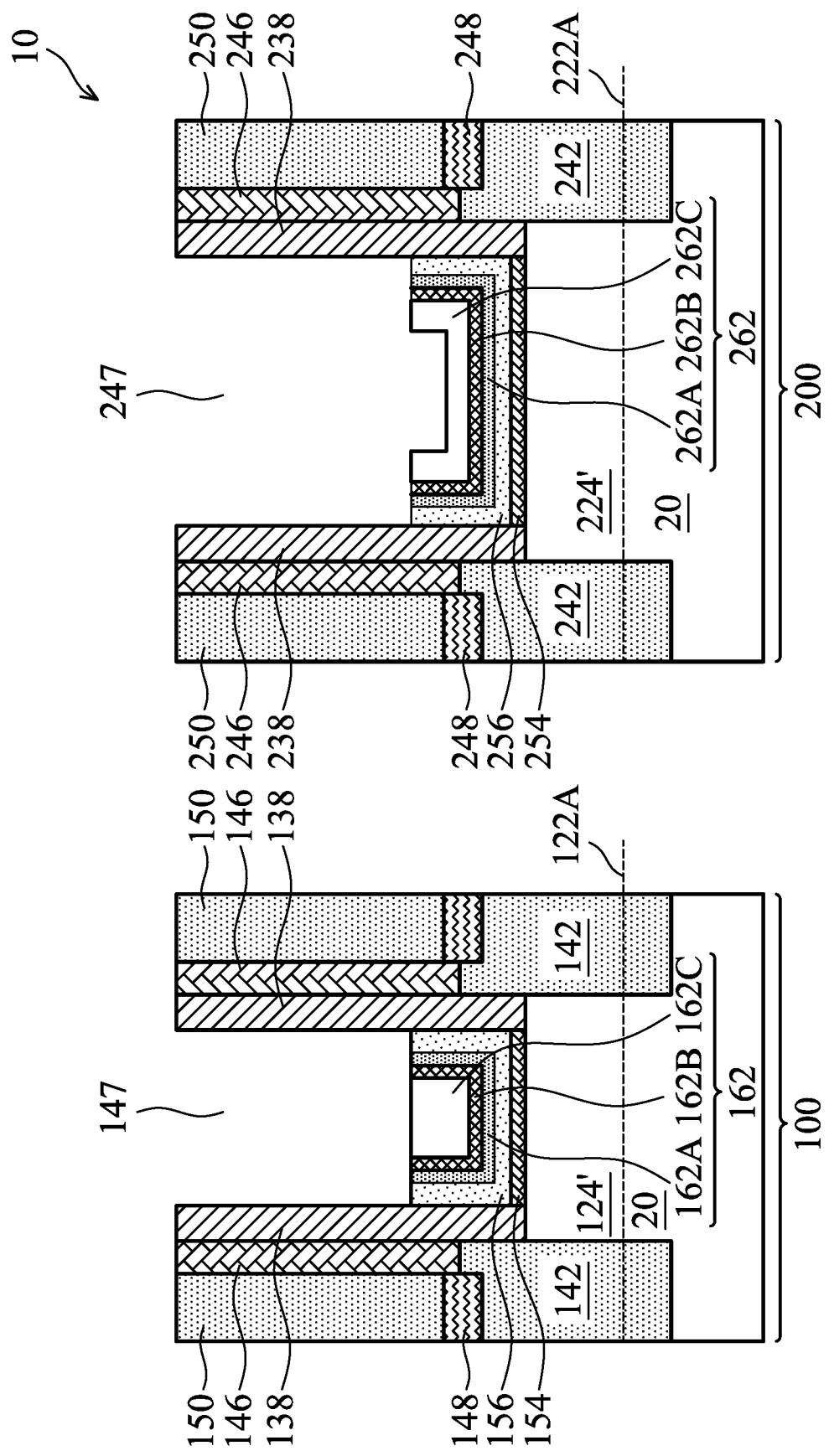
Figure 13:
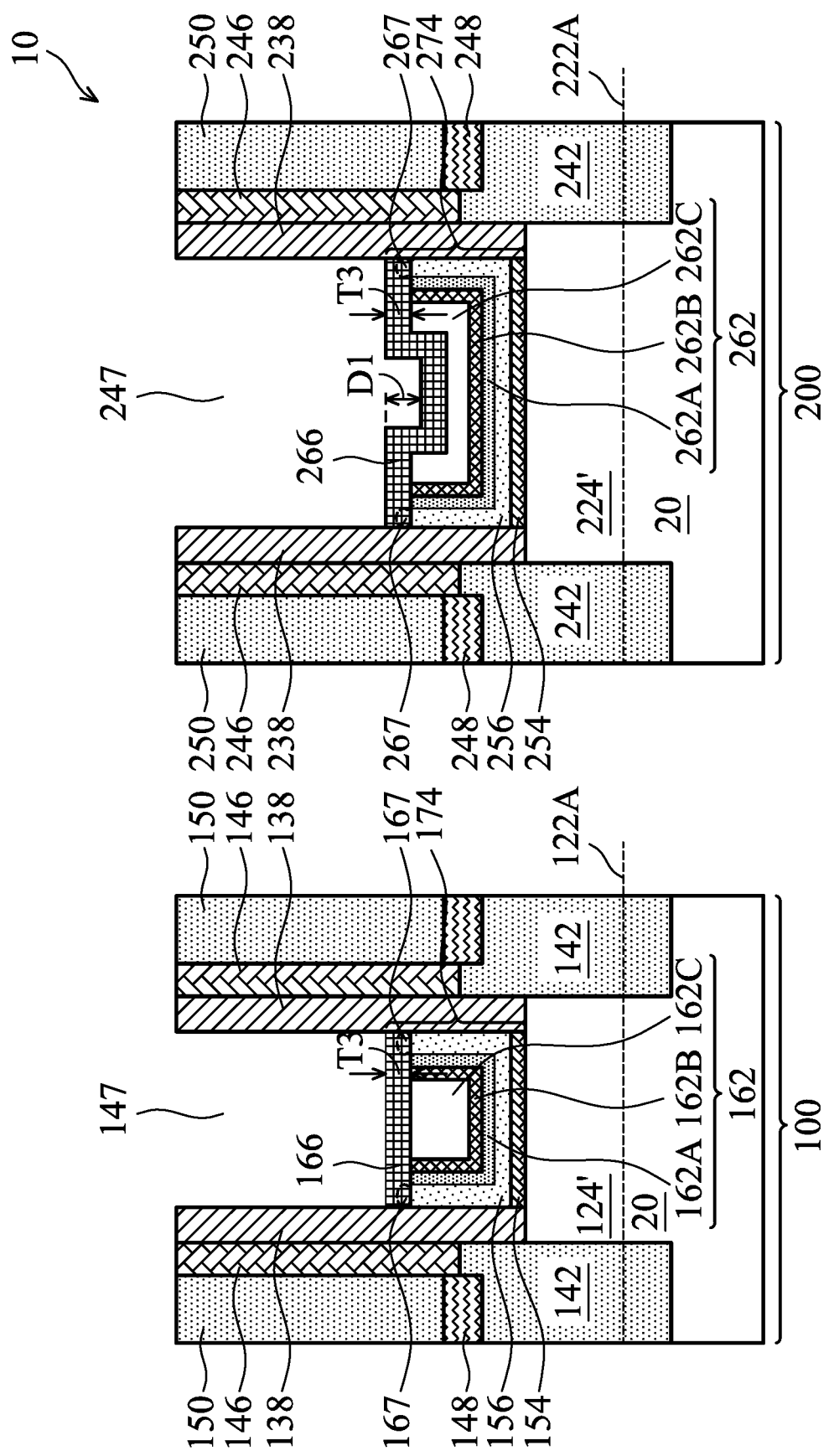

After the etch-back of metal-containing layers 162 and 262 is finished, the remaining portion of protection layer 264 is removed, as shown in FIG. 12. The respective step is illustrated as step 320 in the process flow shown in FIG. 16. The remaining openings 147 and 247 as shown in FIG. 12 is then filled with a conductive (which may be metal-containing) material to form metal layers 166 and 266, respectively, as shown in FIG. 13 in accordance with some embodiments. The respective step is illustrated as step 322 in the process flow shown in FIG. 16. In accordance with some exemplary embodiments, the filling metal is homogenous, which may be formed of W, Cu, Co. Al, Ru, etc. or alloys thereof, providing the filling material has a low resistivity.

Metal layers 166 and 266 are formed using selective deposition, wherein the conductive material is deposited on the exposed surface of conductive materials (such as metal-containing layers 162 and 262), and not on the exposed surfaces of gate spacers 238 and ILDs 146 and 246, etc. In accordance with some exemplary embodiments, the deposition is performed using ALD or CVD. The precursor may include a metal halide (such as $WCl_5$) or a metal organic material and a reducing agent such as $H_2$. The deposition process may be a thermal process performed at an elevated temperature, such as in the range between about 275° C. and about 500° C. The deposition may also be performed with plasma turned on. In accordance with some embodiments, the reaction formula is $MX+H_2\rightarrow M+HX$, wherein M represents the metal, and MX represents the metal halide such as $WCl_5$.

Due to the selective deposition, metal layers 166 and 266 may be conformal layers. Also, metal layer 266 may include a middle portion having a U-shape, and horizontal portions connected to the top ends of the two vertical legs of the U-shaped portion. Depth D1 of the U-shape portion may be greater than about 2 nm, and may be in the range between about 2 nm and about 30 nm. Metal layer 166 may be substantially planar if the top surface of metal-containing layer 162 is planar, or may have a topology following the top-surface profile of metal-containing layer 162. The thickness of metal layers 166 and 266 is selected so that the resistivity of metal layers 166 and 266 is low. For example, thickness T3 of metal layers 166 and 266 may be in the range between about 2 nm and about 12 nm.

Since metal layers 166 and 266 may or may not be grown directly from gate dielectrics 154 and 254, voids may (or may not) be formed in regions 167 and 267, with the top surfaces of gate dielectrics 156 and 256 exposed to the voids (which voids are also represented as 167 and 267). Since gate dielectrics 156 and 256 are thin, the lateral growth of metal layers 166 and 266 causes voids 167 and 267 (if any) to be sealed, and metal layers 166 and 266 will laterally grow to contact gate spacers 138 and 238, respectively.

Figure 14:
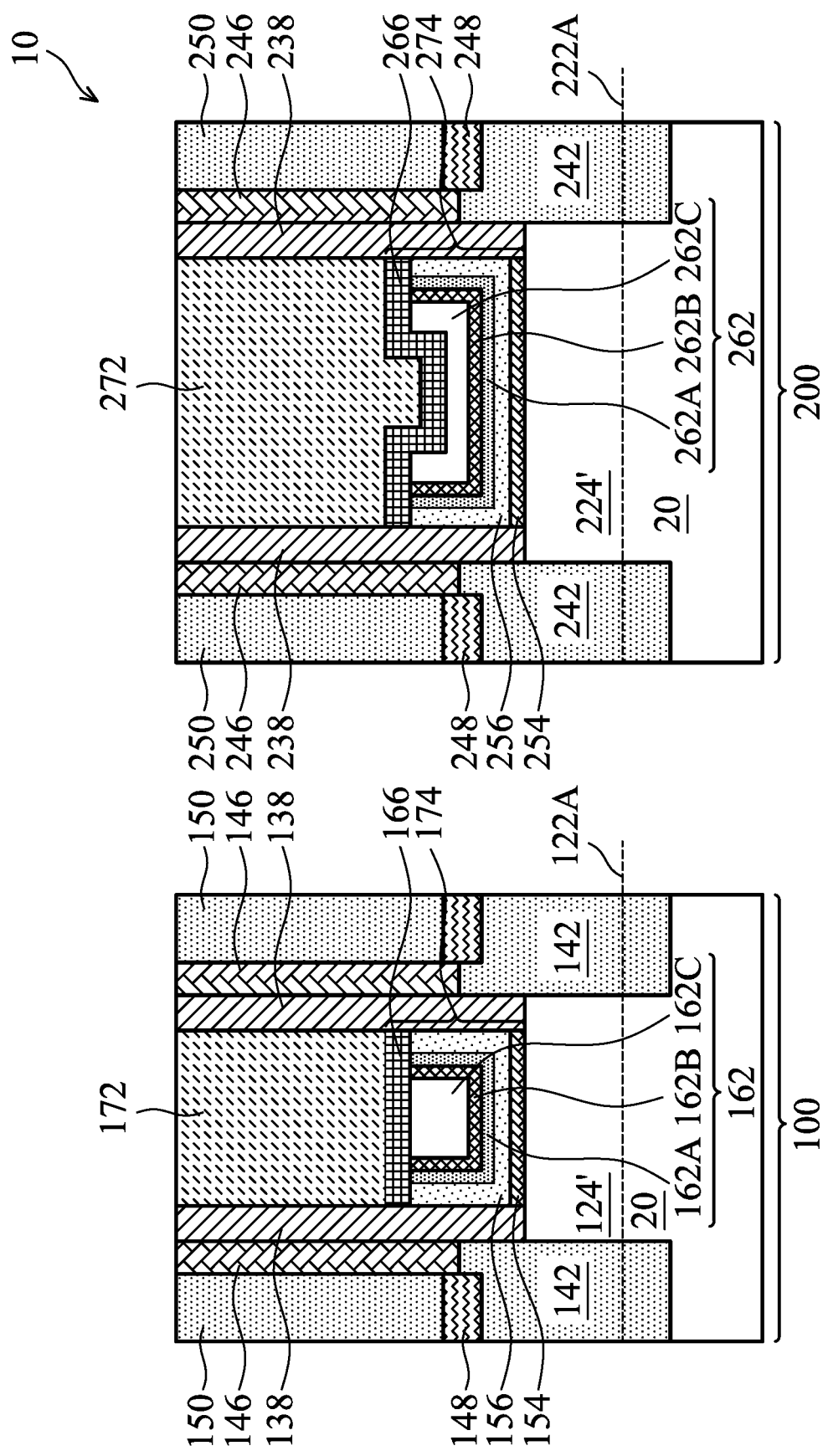

As shown in FIG. 13, metal layer 166 and layers 154, 156, and 162 in combination form replacement gate stack 174, and metal layer 266 and layers 254, 256, and 262 in combination form replacement gate stack 274. Next, the remaining openings are filled with a dielectric material to form hard masks 172 and 272, as shown in FIG. 14. Hard masks 172 and 272 may be dielectric hard masks formed of silicon nitride, silicon oxynitride, silicon oxy-carbide, or the like. The respective step is illustrated as step 324 in the process flow shown in FIG. 16. Hard masks 172 and 272 are also planarized so that their top surfaces are coplanar with the top surface of ILDs 146 and 246.

In a subsequent step, some portions 46A (FIG. 6) of ILD 46 are removed to form contact openings. Source/drain silicide regions 148 and 248 (FIG. 14) are then formed on the surfaces of epitaxy regions 142 and 242, respectively. The formation process includes depositing a metal layer into the contact openings, and performing an anneal to react the metal layer with the exposed surface portions of epitaxy regions 142 and 242, so that silicide regions 148 and 248 are formed. A conductive material such as tungsten is then filled into the contact openings to form contact plugs 150 and 250. Source/drain silicide regions 148 and 248 correspond to the silicide regions 48 in FIG. 7A, and contact plugs 150 and 250 correspond to the contact plugs 50 in FIG. 7A.

Figure 15A:
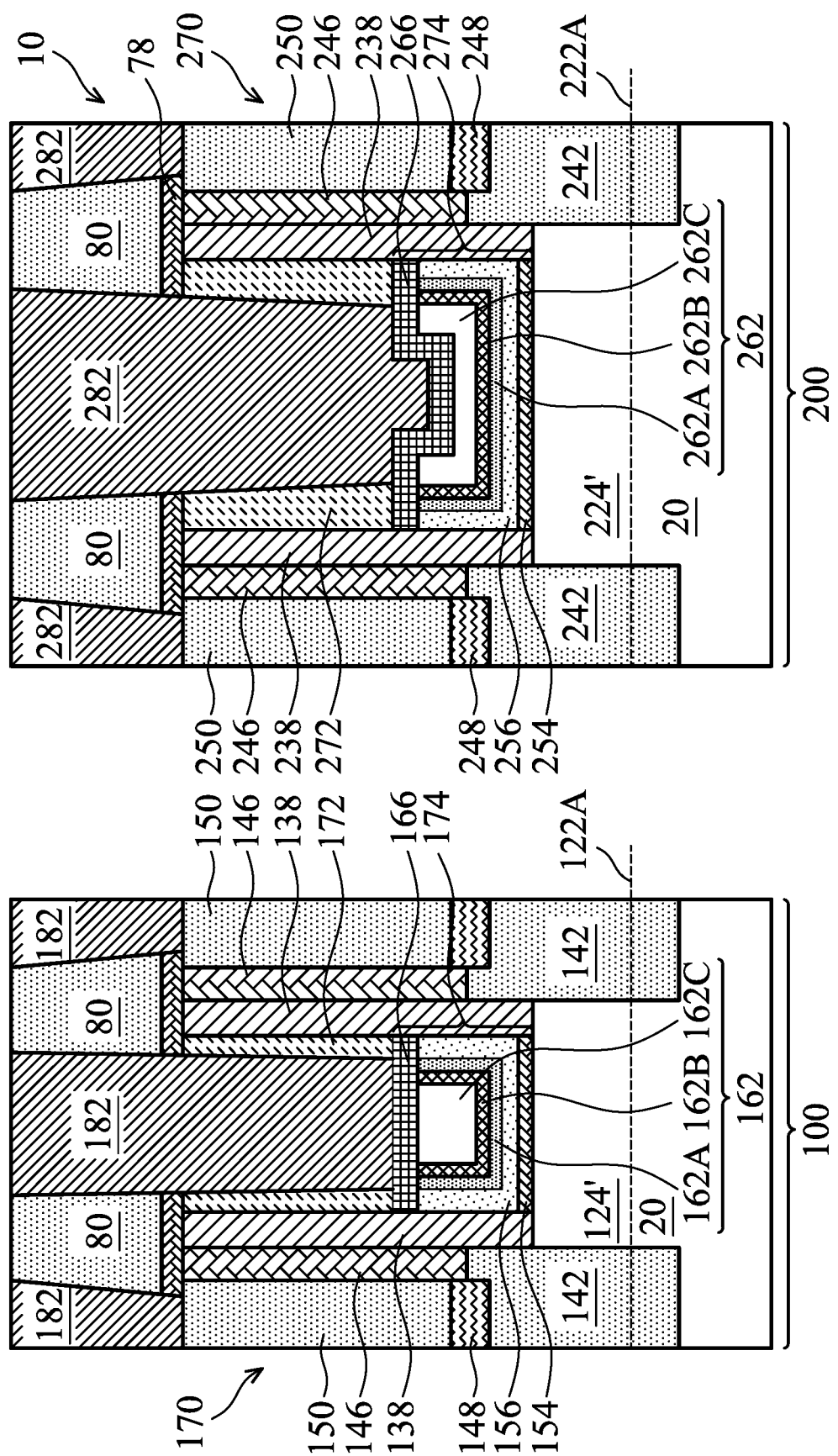
Figure 16:
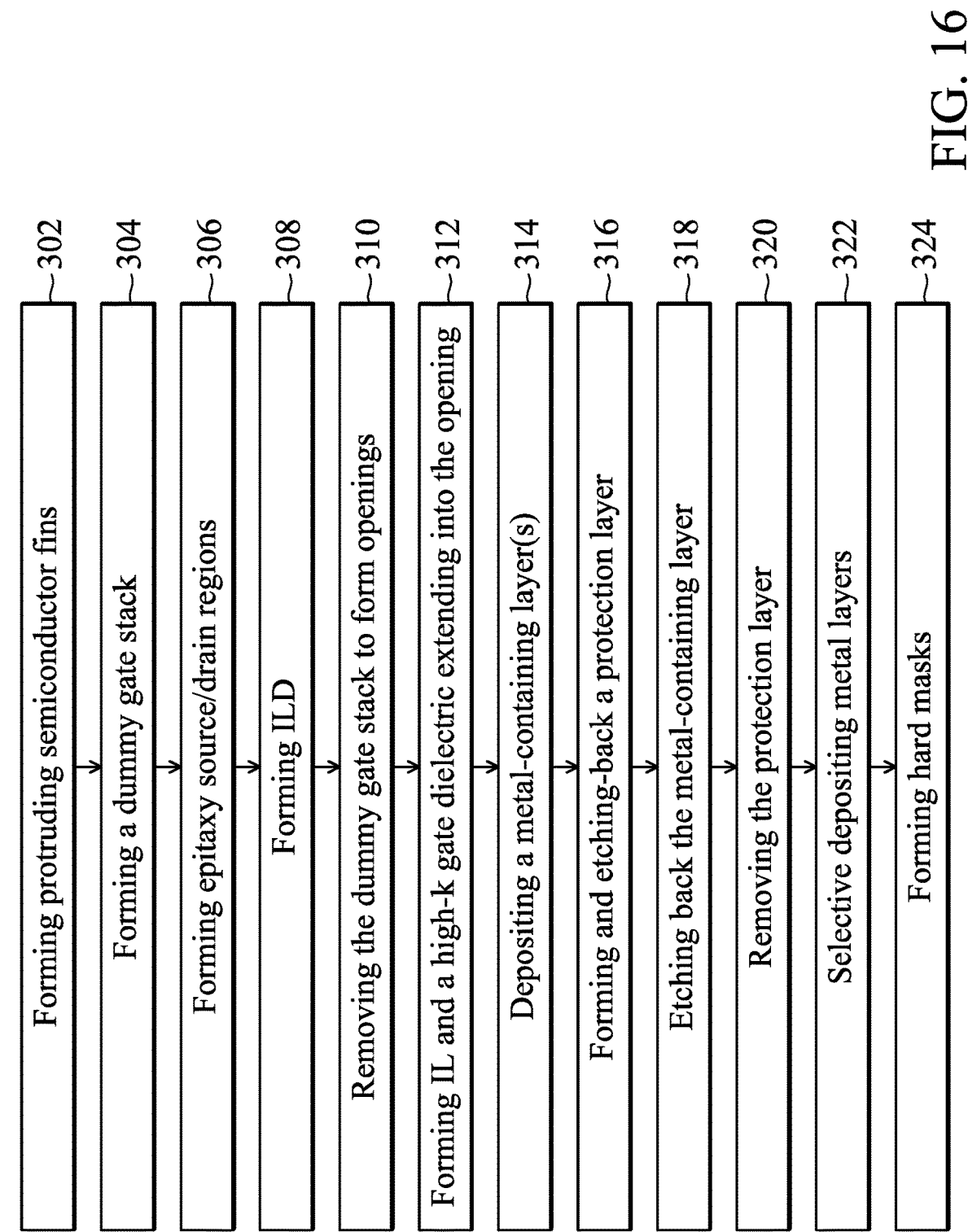
FIG. 16 illustrates a flow chart of a process for forming a FinFET in accordance with some embodiments.

Referring to FIG. 15A, etch stop layer 78 is formed over hard masks 172 and 272, respectively. Etch stop layer 78 is formed of a dielectric material, which may include silicon carbide, silicon nitride, silicon oxynitride, or the like. ILD 80 is formed over etch stop layer 78, and contact plugs 182 and 282 are formed in ILD 80. The formation process may include forming contact plug openings in ILD 80 to expose replacement gate stack 174/274 and source/drain contact plugs 150/250, and filling the contact plug openings with a conductive material(s) to form contact plugs 182 and 282. Some portions of hard masks 172 and 272 (FIG. 14) are also removed, so that gate contact plug 182 and 282 extend into the recesses left by the removed portions of hard masks 172 and 272. Short-channel FinFET 170 and long-channel FinFET 270 are thus formed.

Figure 15B:
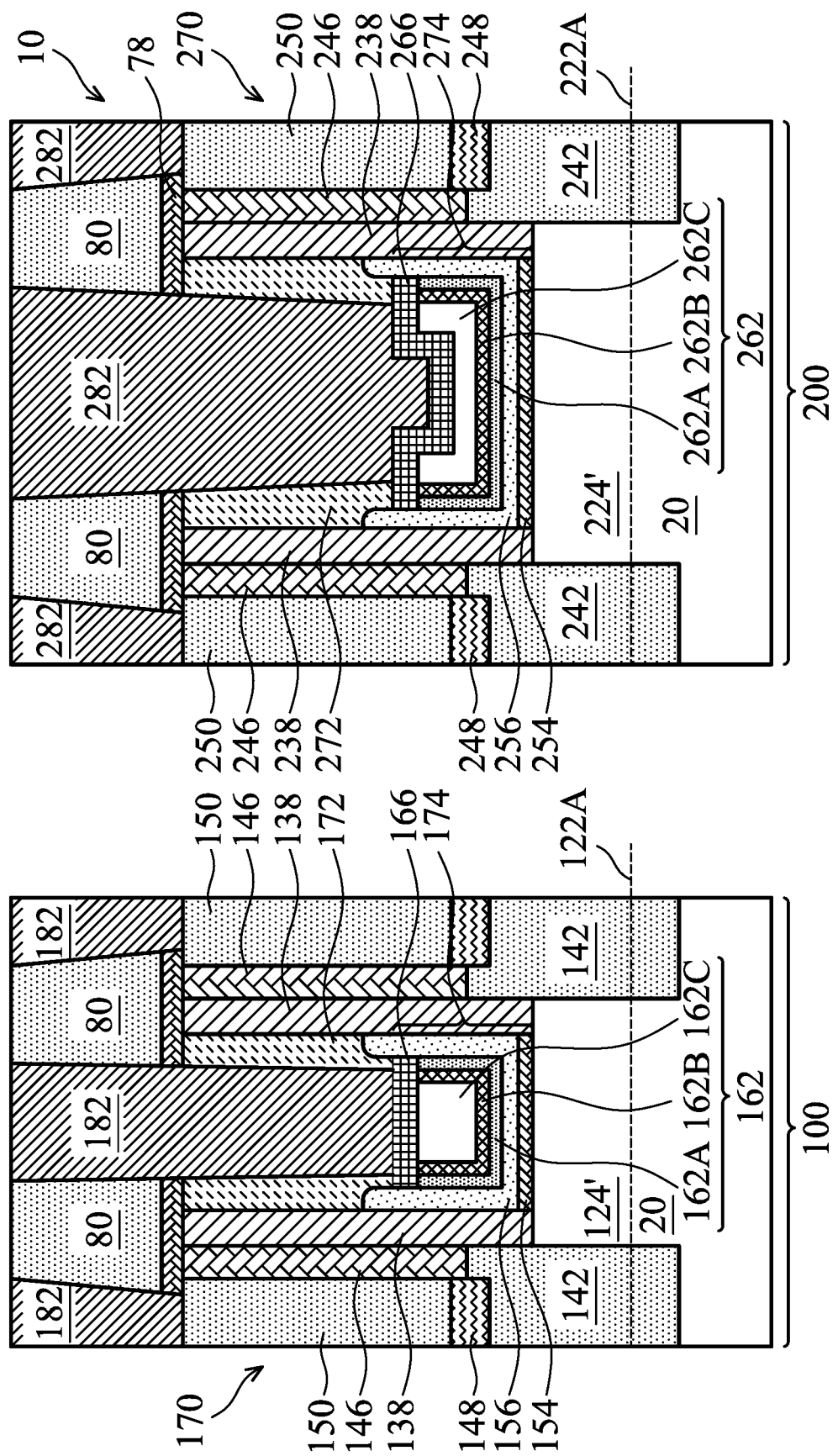
FIGS. 15B, 15C, and 15D are cross-sectional views of FinFETs in accordance with some embodiments, wherein the top ends of metal layers and gate dielectrics in replacement gates have different heights and shapes.

FIG. 15B illustrates FinFETs 170 and 270 in accordance with some embodiments, wherein gate dielectrics 156 and 256 have top surfaces higher than the top surfaces of metal layers 162 and 262, or even higher than the top surfaces of metal layers 166 and 166. This is due to the lower etching rate of gate dielectrics 156 and 256 in the step shown in FIG. 11. As a result, metal layers 166 and 266 do not overlap the top surfaces of gate dielectrics 156 and 256.

Figure 15C:
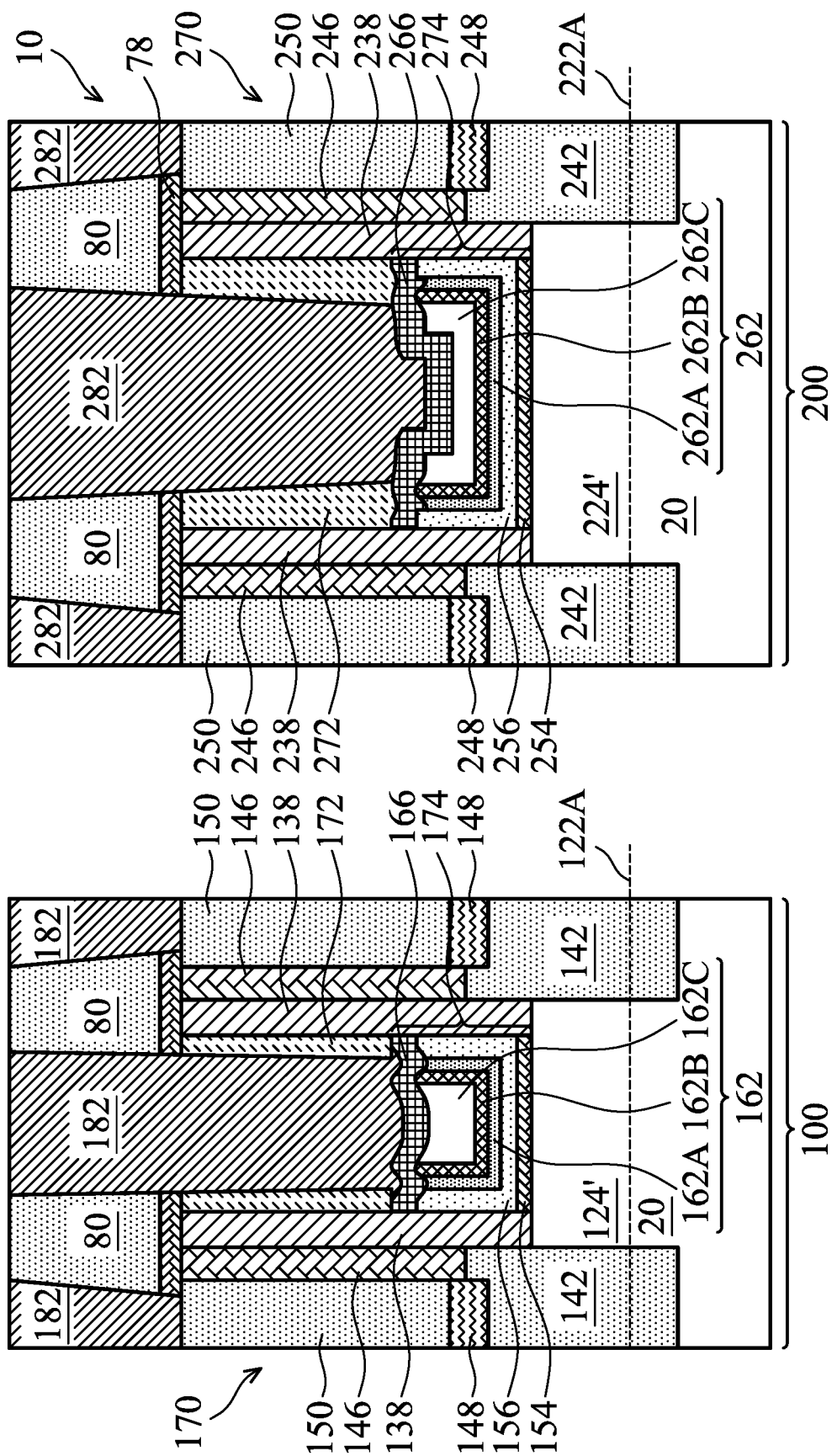
Figure 15D:
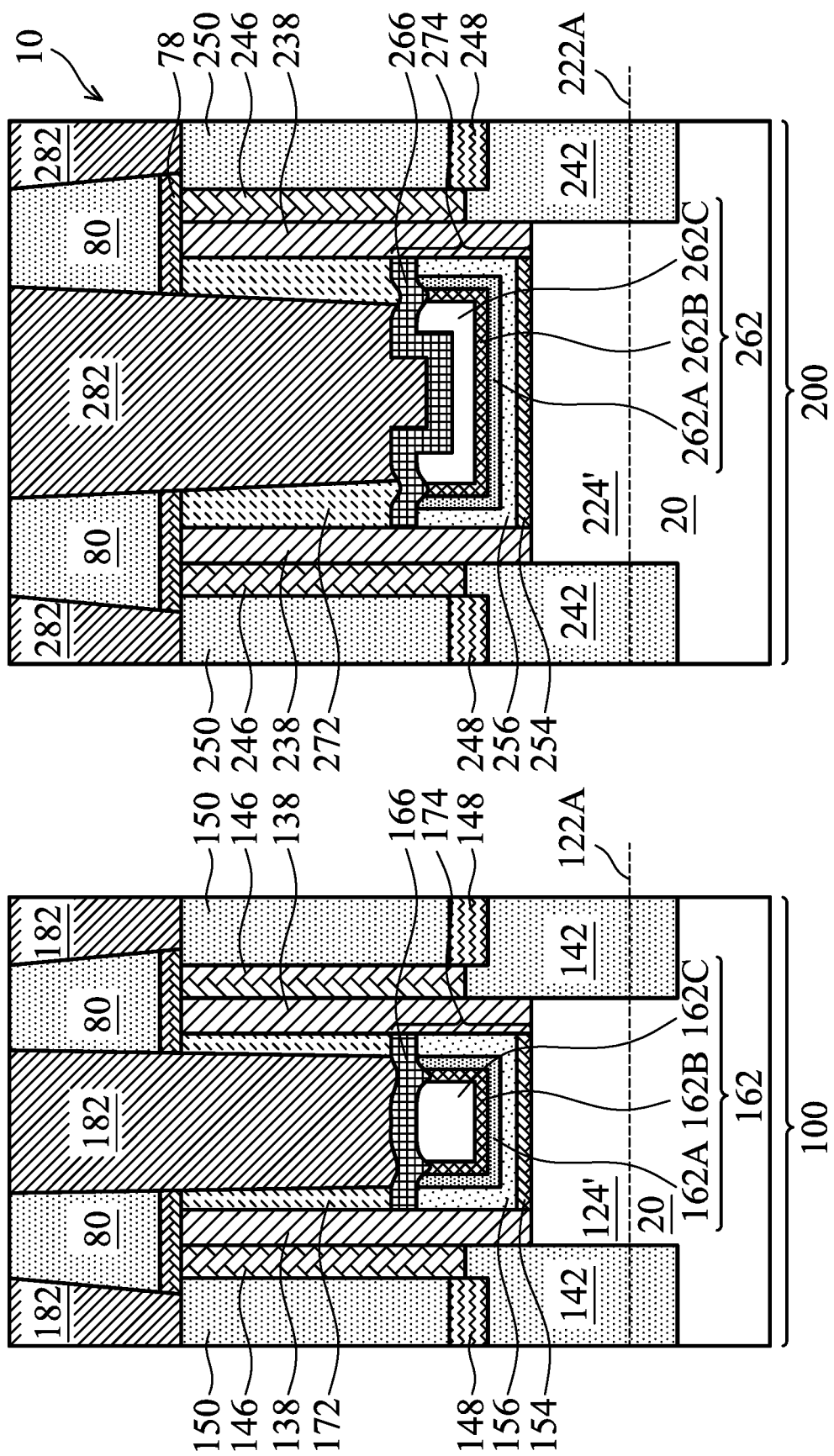

FIGS. 15C and 15D illustrate the top-edge profiles of layers 162A/262A, 162B/262B, and 162C/262C in accordance with some exemplary embodiments. As discussed in preceding paragraphs, due to different etching rates, the top edges of layers 162A/262A, 162B/262B, and 162C/262C may have different shapes. For example, as shown in FIG. 15C, the top edges of layers 162B/262B are higher than the top edges of layers 162A/262A and 162C/262C. In FIG. 15D, the top edges of layers 162B/262B are lower than the top edges of layers 162A/262A and 162C/262C. The top surfaces of layers 162A/262A, 162B/262B, and 162C/262C may be higher than, lower than, or coplanar with each other in any combination, and metal layers 166 and 266 also have bottom surfaces and top surfaces following the profiles of the top edges of layers 162A/262A and 162C/262C.

The embodiments of the present disclosure have some advantageous features. By forming protection layers for etching one or more metal-containing layer and then performing an etch-back and selectively depositing metal layers, there is no need to fully fill opening (247) with metal layers, and then performing planarization (CMP). The gate-height loss caused by the CMP is thus avoided, wherein the gate-height loss is due to the thinning of ILD during the CMP. Also, with the selective deposition of metal layers 166 and 266 in openings, all of the metal-containing layers are covered with a homogenous metal material (166 and 266), and hence in the formation of gate contact openings, a homogenous metal material, rather than the top edges of multiple materials of the metal layers, are exposed to the gate contact openings. The process is thus more predictable and easier to control.

In accordance with some embodiments of the present disclosure, a method includes forming a dummy gate stack, forming a dielectric layer, with the dummy gate stack located in the dielectric layer, removing the dummy gate stack to form a opening in the dielectric layer, forming a metal layer extending into the opening, and etching back the metal layer. The remaining portions of the metal layer in the opening have edges lower than a top surface of the dielectric layer. A conductive layer is selectively deposited in the opening. The conductive layer is over the metal layer, and the metal layer and the conductive layer in combination form a replacement gate. A source region and a drain region are also formed on opposite sides of the replacement gate.

In accordance with some embodiments of the present disclosure, a method includes forming a first dummy gate stack and a second dummy gate stack, forming first gate spacers on sidewalls of the first dummy gate stack and second gate spacers on sidewalls of the second dummy gate stack, forming an inter-layer dielectric, with the first and the second gate spacers and the first and the second dummy gate stacks being located in the inter-layer dielectric, and removing the first and the second dummy gate stacks to form a first opening and a second opening, respectively. The first opening is narrower than the second opening. The method further includes forming a gate dielectric layer extending into both the first opening and the second opening, and depositing a metal-containing layer. The metal-containing layer includes a first portion fully filling the first opening, and a second portion partially filling the second opening. The method further includes filling a remaining portion of the second opening with a protection layer, and using the protection layer as an etching mask to etch-back a portion of the second portion of the metal-containing layer. A portion of the first portion of the metal-containing layer is simultaneously etched. The protection layer is then etched. A conductive material is selectively deposited into the first opening and the second opening, wherein no conductive material is formed over the dielectric layer.

In accordance with some embodiments of the present disclosure, a device includes gate spacers, a gate dielectric extending into a space between the gate spacers, and a metal-containing layer over a bottom portion of the gate dielectric. The metal-containing layer includes a bottom portion at a bottom of the space, and sidewall portions connected to ends of the bottom portion. The top edges of the sidewall portions are lower than the top edges of the gate spacers. A conductive layer is over the metal-containing layer. The conductive layer is located between the gate spacers, and a portion of the conductive layer has a U-shape in a cross-sectional view of the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
forming a first dummy gate stack;
forming a dielectric layer, with the first dummy gate stack located in the dielectric layer;
removing the first dummy gate stack to form a first opening in the dielectric layer;
forming a second dummy gate stack simultaneously as the first dummy gate stack;
removing the second dummy gate stack to form a second opening in the dielectric layer;
forming a metal layer extending into the first opening, wherein the metal layer further comprises an additional portion fully filling the second opening;
etching back the metal layer, wherein remaining portions of the metal layer in the first opening have edges lower than a top surface of the dielectric layer, wherein the etching back of the metal layer comprises:
  filling a protection layer over the metal layer, wherein the protection layer partially fills the first opening;
  etching the metal layer using the protection layer as an etching mask; and
  removing the protection layer;
recessing the additional portion of the metal layer without using any protection layer in the second opening as an etching mask;
selectively depositing a first conductive layer in the first opening, wherein the first conductive layer is over the metal layer, and the metal layer and the first conductive layer in combination form a replacement gate; and
selectively depositing a second conductive layer in the second opening.

2. The method of claim 1 further comprising, before the metal layer is formed, forming a first gate dielectric in the first opening, wherein after the first conductive layer is selectively deposited, a void is formed between the first conductive layer and the first gate dielectric.

3. The method of claim 1, wherein the forming the metal layer comprises depositing a work-function layer.

4. The method of claim 1, wherein when the first conductive layer is selectively deposited into the first opening, no conductive layer is simultaneously deposited outside of the first opening and over the dielectric layer.

5. The method of claim 1, wherein the forming the metal layer comprises forming a plurality of metal layers, and the plurality of metal layers is formed of different materials.

6. The method of claim 1, wherein the first conductive layer comprises:
  a first portion having a U-shaped cross-sectional view; and
  second horizontal portions connected to opposite top ends of the U-shaped first portion.

7. The method of claim 1, wherein the etching back the metal layer and the recessing the additional portion of the metal layer are performed in a common process.

8. The method of claim 1 further comprising forming a high-k dielectric layer extending into the first opening, wherein when the metal layer is etched back, the high-k dielectric layer is also etched back.

9. A method comprising:
  forming a first dummy gate stack and a second dummy gate stack;
  forming first gate spacers on sidewalls of the first dummy gate stack and second gate spacers on sidewalls of the second dummy gate stack;
  forming an inter-layer dielectric, with the first and the second gate spacers and the first and the second dummy gate stacks being located in the inter-layer dielectric;
  removing the first and the second dummy gate stacks to form a first opening and a second opening, respectively, wherein the first opening is narrower than the second opening;
  forming a gate dielectric layer extending into both the first opening and the second opening;
  depositing a metal-containing layer, wherein the metal-containing layer comprises a first portion fully filling the first opening, and a second portion partially filling the second opening;
  filling a remaining portion of the second opening with a protection layer;
  using the protection layer as an etching mask to etch-back a portion of the second portion of the metal-containing layer, wherein a portion of the first portion of the metal-containing layer is simultaneously etched;
  removing the protection layer; and
  selectively depositing a conductive material into the first opening and the second opening, wherein no conductive material is formed over the gate dielectric layer.

10. The method of claim 9, wherein when the etch-back is started, the protection layer fills a lower part of the second opening, with an upper part of the second opening unfilled.

11. The method of claim 9, wherein the conductive material is deposited on electrical conductive materials and not on dielectric materials in the second opening.

12. The method of claim 9, wherein the first portion of the metal-containing layer is etched back without using any protection layer in the first opening.

13. The method of claim 7, wherein after the conductive material is selectively deposited:
  a first void is formed at a first corner between a first portion of the conductive material in the first opening, one of the first gate spacers, and a first portion of the gate dielectric layer in the first opening; and
  a second void is formed at a second corner between a second portion of the conductive material in the second opening, one of the second gate spacers, and a second portion of the gate dielectric layer in the second opening.

14. The method of claim 9, wherein the conductive material is deposited into the first opening and the second opening as conformal layers.

15. A method comprising:
  depositing a metal layer comprising:
    a first portion extending into a first opening in a dielectric layer; and
    a second portion fully filling a second opening in the dielectric layer;
  coating a protection layer over the metal layer, wherein the protection layer has a portion filled into the first opening, and an entirety of the protection layer is outside of the second opening;
  etching back the protection layer to remove all of the protection layer overlapping the second opening, and a remaining portion of the protection layer is in the first opening;
  etching back the metal layer using the remaining portion of the protection layer as an etching mask, so that remaining portions of the metal layer in the first opening and the second opening have top edges lower than a top surface of the dielectric layer;
  removing the protection layer; and
  selectively depositing a conductive layer comprising:
    a first portion in the first opening and over the metal layer; and
    a second portion in the second opening and over the metal layer.

16. The method of claim 15, wherein during the etching the metal layer using the remaining portion of the protection layer, a further portion of the remaining portion of the protection layer is partially consumed.

17. The method of claim 15, wherein the depositing the metal layer comprises depositing a work-function layer.

18. The method of claim 15 further comprising, before the metal layer is deposited, forming a first gate dielectric and a second gate dielectric extending into the first opening and the second opening, respectively, wherein the first gate dielectric and the second gate dielectric are over a first semiconductor region and a second semiconductor region, respectively.

19. The method of claim 15, wherein after the conductive layer is selectively deposited:
   a first void is formed underlying the first position of the conductive layer, and a second void is formed underlying the second portion of the conductive layer.

20. The method of claim 15, wherein:
   the first portion of the conductive layer has a U-shaped cross-sectional view; and
   an entirety of the second portion of the conductive layer is planar.

* * * * *

UNITED STATES PATENT AND TRADEMARK OFFICE
CERTIFICATE OF CORRECTION

PATENT NO. : 10,879,370 B2  
APPLICATION NO. : 15/621518  
DATED : December 29, 2020  
INVENTOR(S) : Peng-Soon Lim et al.

Page 1 of 1

It is certified that error appears in the above-identified patent and that said Letters Patent is hereby corrected as shown below:

In the Claims

In Column 13, Line 3, Claim 19, delete "position" and insert --portion--.

Signed and Sealed this  
Sixth Day of April, 2021

Drew Hirshfeld  
*Performing the Functions and Duties of the*  
*Under Secretary of Commerce for Intellectual Property and*  
*Director of the United States Patent and Trademark Office*